(12) United States Patent
Jang et al.

(10) Patent No.: US 12,376,437 B2
(45) Date of Patent: Jul. 29, 2025

(54) DISPLAY DEVICE AND TILED DISPLAY DEVICE INCLUDING THE SAME

(71) Applicant: Samsung Display Co., Ltd., Yongin-si (KR)

(72) Inventors: Dae Hwan Jang, Seoul (KR); Cheol Min Park, Hwaseong-si (KR); Woo Suk Seo, Yongin-si (KR); Jin Ho Cho, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1066 days.

(21) Appl. No.: 17/362,394

(22) Filed: Jun. 29, 2021

(65) Prior Publication Data
US 2022/0052240 A1 Feb. 17, 2022

(30) Foreign Application Priority Data

Aug. 14, 2020 (KR) ........................ 10-2020-0102369

(51) Int. Cl.
| | |
|---|---|
| *H10H 20/857* | (2025.01) |
| *G09F 9/33* | (2006.01) |
| *H10H 20/851* | (2025.01) |
| *H10H 29/14* | (2025.01) |

(52) U.S. Cl.
CPC ............. *H10H 20/857* (2025.01); *G09F 9/33* (2013.01); *H10H 20/851* (2025.01); *H10H 29/142* (2025.01)

(58) Field of Classification Search
CPC ....... H01L 33/62; H01L 27/156; H01L 33/50; H01L 25/167; G09F 9/33; H10H 20/857; H10H 20/851; H10H 29/142; H10H 20/84; H10H 20/8515
See application file for complete search history.

(56) References Cited

U.S. PATENT DOCUMENTS

| | | |
|---|---|---|
| 9,723,724 B2 | 8/2017 | Mitarai et al. |
| 10,410,884 B2 | 9/2019 | Mitarai et al. |
| 10,998,511 B2 | 5/2021 | Kim |

(Continued)

FOREIGN PATENT DOCUMENTS

| | | |
|---|---|---|
| JP | 2015-038962 | 2/2015 |
| KR | 10-1157425 B1 | 6/2012 |

(Continued)

*Primary Examiner* — Ratisha Mehta
(74) *Attorney, Agent, or Firm* — Womble Bond Dickinson (US) LLP

(57) ABSTRACT

A display device includes: a substrate including a display area and a non-display area, the substrate having a first portion of a through hole penetrating in a thickness direction thereof in the display area, an etching stopper on one surface of the substrate, the etching stopper having a second portion of the through hole connected to one end of the first portion of the through hole, a display layer on one surface of the etching stopper, and the display layer including a connection line on the second portion of the through hole, an insulating layer on other surface opposite to the one surface of the substrate, the insulating layer having a third portion of the through hole connected to the other end of the first portion of the through hole, and a pad unit on an other surface of the insulating layer and connected to the connection line.

20 Claims, 24 Drawing Sheets

(56) References Cited

U.S. PATENT DOCUMENTS

| | | |
|---|---|---|
| 11,342,525 B2 | 5/2022 | Kim et al. |
| 11,864,455 B2 | 1/2024 | Kim |
| 2015/0021081 A1 | 1/2015 | Mitarai et al. |
| 2017/0301558 A1 | 10/2017 | Mitarai et al. |
| 2018/0053905 A1* | 2/2018 | Lee ..................... H10K 59/126 |
| 2018/0190747 A1 | 7/2018 | Son et al. |
| 2020/0176537 A1 | 6/2020 | Son et al. |
| 2020/0359499 A1* | 11/2020 | Hwu ..................... H10K 59/131 |
| 2021/0273147 A1 | 9/2021 | Jung et al. |

FOREIGN PATENT DOCUMENTS

| | | |
|---|---|---|
| KR | 10-1820258 B1 | 1/2018 |
| KR | 10-2019-0071274 A | 6/2019 |
| KR | 10-2020-0009402 A | 1/2020 |
| KR | 2020-0001654 | 1/2020 |
| KR | 2020-0058665 | 5/2020 |

* cited by examiner

DISPLAY DEVICE AND TILED DISPLAY DEVICE INCLUDING THE SAME

CROSS-REFERENCE TO RELATED APPLICATION

This application claims priority to and the benefit of Korean Patent Application No. 10-2020-0102369 filed on Aug. 14, 2020, in the Korean Intellectual Property Office, the content of which in its entirety is herein incorporated by reference.

BACKGROUND

1. Field

The present disclosure relates to a display device and a tiled display device including the same.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device, such as, a liquid crystal display device, a field emission display device, and/or an organic light emitting display device. Among the flat panel display devices, in the light emitting display device, because each of pixels of a display panel includes a light emitting element capable of emitting light by itself, an image can be displayed without a backlight unit providing light to the display panel.

When the display device is manufactured in a large size, a defect rate of the light emitting element may increase due to an increase in the number of pixels, thereby deteriorating productivity or reliability of the display device. To solve this problem, in a tiled display device, a large-sized screen may be implemented by connecting a plurality of display devices having a relatively small size. The tiled display device may include a boundary portion called a seam between the plurality of display devices, due to a non-display area or a bezel area of each of the plurality of display devices adjacent to each other. When a single image is displayed on the entire screen, the boundary portion between the plurality of display devices gives a sense of disconnection over the entire screen, thereby reducing a sense of immersion in the image.

SUMMARY

Embodiments of the present disclosure provide a tiled display device capable of removing or substantially removing a sense of disconnection between a plurality of display devices and improving a sense of immersion in an image, by preventing the recognition of boundary portions or non-display areas between the plurality of display devices.

Embodiments of the present disclosure also provide a tiled display device capable of improving reliability by improving process precision of a through hole penetrating each substrate of a plurality of display devices.

However, aspects of embodiments of the present disclosure are not restricted to those set forth herein. The above and other aspects of embodiments of the present disclosure will become more apparent to one of ordinary skill in the art to which the present disclosure pertains by referencing the detailed description of the present disclosure given below.

According to an embodiment of the present disclosure, a display device includes: a substrate including a display area and a non-display area, the substrate having a first portion of a through hole penetrating in a thickness direction thereof in the display area, an etching stopper on one surface of the substrate, the etching stopper having a second portion of the through hole connected to one end of the first portion of the through hole, a display layer on one surface of the etching stopper, the display layer having a connection line on the second portion of the through hole, an insulating layer on other surface opposite to the one surface of the substrate, the insulating layer having a third portion of the through hole connected to an other end opposite to the one end of the first portion of the through hole, and a pad unit on an other surface of the insulating layer and connected to the connection line through the through hole.

The insulating layer may include: a mask portion overlapping the display area of the substrate and surrounding the third portion of the through hole, and a plurality of alignment mark portions overlapping the non-display area of the substrate.

The plurality of alignment mark portions may be spaced from the mask portion, and each of the plurality of alignment mark portions may be adjacent to each of a plurality of corners of the mask portion.

Each of the plurality of alignment mark portions may protrude from a corresponding one of a plurality of corners of the mask portion.

The display device may further include: a flexible film on the other surface of the insulating layer and connected to the pad unit, and a source driver on the flexible film.

The display area may include a plurality of pixels and at least one line connected to each of the plurality of pixels, and the connection line may be connected to the at least one line.

The display layer may include a plurality of data lines and a plurality of connection lines, and each of the plurality of data lines may be connected to a corresponding one of the plurality of connection lines corresponding to a corresponding one of a plurality of through holes.

The plurality of through holes corresponding to adjacent data lines from among the plurality of data lines may be spaced from each other along a direction perpendicular to the data line.

The etching stopper may include: a first etching stopper corresponding to a part of the plurality of through holes, and a second etching stopper spaced from the first etching stopper and corresponding to another part of the plurality of through holes.

The etching stopper may be integrally formed to overlap the display area.

The display layer may include: a buffer layer on the etching stopper, a thin film transistor layer on the buffer layer, and a light emitting element layer on the thin film transistor layer and including a plurality of light emitting members corresponding to a plurality of emission areas of the display area.

The display layer may further include: a first planarization layer configured to planarize a top surface of the light emitting element layer, a wavelength conversion unit on the first planarization layer and corresponding to one of the plurality of emission areas, a light transmission unit on the first planarization layer and corresponding to another one of the plurality of emission areas, a second planarization layer configured to planarize top surfaces of the wavelength conversion unit and the light transmission unit, and a plurality of color filters on the second planarization layer and corresponding to the plurality of emission areas.

According to an embodiment of the present disclosure, a tiled display device includes: a plurality of display devices, each of the plurality of display devices including a display area having a plurality of pixels and a non-display area surrounding the display area, and a coupling member configured to couple the plurality of display devices. Each of the plurality of display devices includes: a substrate having a first portion of a through hole penetrating in a thickness direction thereof in the display area, an etching stopper on one surface of the substrate, the etching stopper having a second portion of the through hole connected to one end of the first portion of the through hole, a display layer on one surface of the etching stopper, the display layer having a connection line on the second portion of the through hole, an insulating layer on other surface opposite to the one surface of the substrate, the insulating layer having a third portion of the through hole connected to an other end opposite to the one end of the first portion of the through hole, and a pad unit on an other surface of the insulating layer and connected to the connection line through the through hole.

The insulating layer may include: a mask portion overlapping the display area of the substrate and surrounding the third portion of the through hole, and a plurality of alignment mark portions overlapping the non-display area of the substrate.

The plurality of alignment mark portions may be spaced from the mask portion, and each of the plurality of alignment mark portions may be located adjacent to corresponding one of a plurality of corners of the mask portion.

Each of the plurality of alignment mark portions may protrude from corresponding one of a plurality of corners of the mask portion.

Each of the plurality of display devices may further includes: a flexible film on the other surface of the insulating layer and connected to the pad unit, and a source driver on the flexible film.

The display area may include at least one line connected to each of the plurality of pixels, and the connection line may be connected to the at least one line.

The display layer may include a plurality of data lines and a plurality of connection lines, and each of the plurality of data lines may be connected to corresponding one of the plurality of connection lines through a plurality of through holes.

The plurality of through holes corresponding to adjacent data lines from among the plurality of data lines may be spaced from each other along a direction perpendicular to the data line.

In accordance with the display device and the tiled display device including the same according to described embodiments, the display device includes an insulating layer on a bottom surface of a substrate and having a mask portion and an alignment mark portion, so that the position of a through hole can be precisely adjusted, and the size of the through hole can be reduced or minimized. The mask portion of the insulating layer may protect a region of the bottom surface of the substrate in which the through hole is not formed in a wet etching process of the substrate. After the mask portion of the insulating layer is used in a process of forming a modified region of the substrate, it is also used in a process of forming the through hole, so that process time and cost can be reduced. Therefore, in the tiled display device, it is possible to remove a sense of disconnection between a plurality of display devices and improving a sense of immersion in an image, by preventing or reducing the recognition of boundary portions or non-display areas between the plurality of display devices.

The present disclosure is not limited to the aforementioned embodiments, and various other embodiments are included in the present disclosure.

BRIEF DESCRIPTION OF THE DRAWINGS

The above and other aspects and features of embodiments the present disclosure will become more apparent by describing in detail embodiments thereof with reference to the attached drawings, in which.

DETAILED DESCRIPTION

Figure 1:
FIG. 1 is a plan view illustrating a tiled display device according to an embodiment.

In the following description, for the purposes of explanation, numerous specific details are set forth in order to provide a thorough understanding of various embodiments or implementations of the present disclosure. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the spirit or scope of the present disclosure.

Unless otherwise specified, the illustrated embodiments are to be understood as providing example features of varying detail of some ways in which the embodiments may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the spirit or scope of the present disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this disclosure, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the present disclosure. Further, the blocks, units, and/or modules of some embodiments may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

FIG. 1 is a plan view illustrating a tiled display device according to an embodiment.

Referring to FIG. 1, a tiled display device TD may include a plurality of display devices 10. The plurality of display devices 10 may be arranged in a grid form, but are not limited thereto. The plurality of display devices 10 may be connected in a first direction (X-axis direction) or a second direction (Y-axis direction), and the tiled display device TD may have a particular shape. For example, the plurality of display devices 10 may have the same size, but are not limited thereto. For another example, the plurality of display devices 10 may have different sizes.

Each of the plurality of display devices 10 may have a rectangular shape including long sides and short sides. The plurality of display devices 10 may be arranged such that the long sides or the short sides thereof are connected to each other. Some of the display devices 10 may be disposed at the edge of the tiled display device TD to form one side of the tiled display device TD. Some others of the display devices 10 may be disposed at corners of the tiled display device TD to form two adjacent sides of the tiled display device TD. Yet some others of the display devices 10 may be disposed on the inner area of the tiled display device TD, and may be surrounded by other display devices 10.

Each of the plurality of display devices 10 may include a display area DA and a non-display area NDA. The display area DA may include a plurality of pixels to display an image. The non-display area NDA may be disposed around the display area DA to surround the display area DA along the edge or periphery of the display area DA, and may not display an image.

The tiled display device TD may have a planar shape as a whole, but is not limited thereto. The tiled display device TD may have a three-dimensional shape to provide a three-dimensional effect to a user. For example, when the tiled display device TD has a three-dimensional shape, at least some of the plurality of display devices 10 may have a curved shape. For another example, the plurality of display devices 10 may each have a planar shape and may be connected to each other at an angle (e.g., a set or predetermined angle), so that the tiled display device TD may have a three-dimensional shape.

The tiled display device TD may be formed by connecting the non-display areas NDA of the adjacent display devices 10. The plurality of display devices 10 may be connected to each other through a connection member or an adhesive member. Accordingly, the non-display areas NDA between the plurality of display devices 10 may be surrounded by the adjacent display areas DA. The distance between the display areas DA of the plurality of display devices 10 may be small enough that the non-display areas NDA between the plurality of display devices 10 or the boundary portions between the plurality of display devices 10 are not recognized by the user. In some embodiments, the reflectance of external light of the display areas DA of the plurality of display devices 10 may be substantially the same as that of the non-display areas NDA between the plurality of display devices 10. Accordingly, in the tiled display device TD, the boundary portions or the non-display areas NDA between the plurality of display devices 10 may be prevented or substantially prevented from being recognized, thereby removing or reducing a sense of disconnection between the plurality of display devices 10 and improving a sense of immersion in an image.

Figure 2:
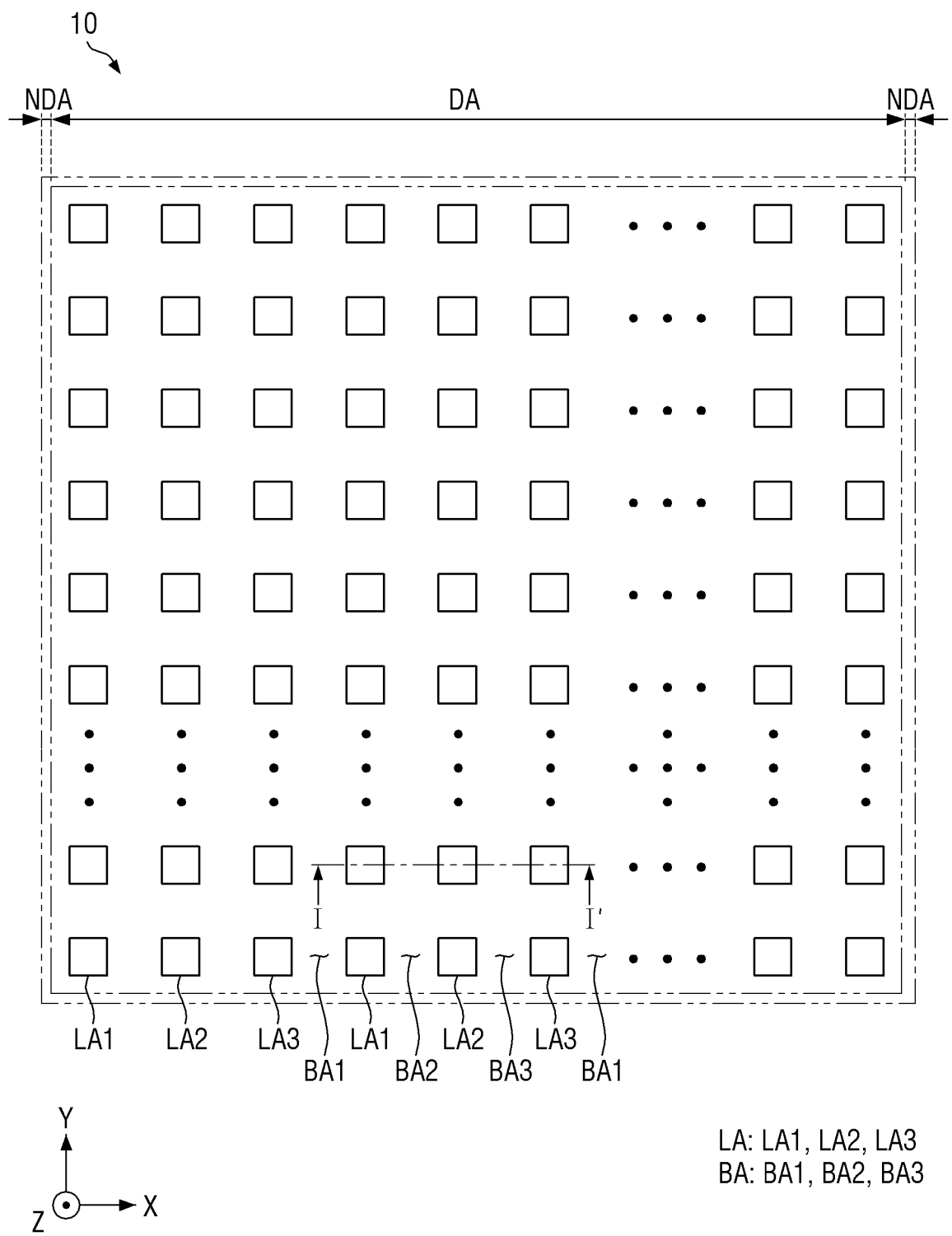
FIG. 2 is a plan view illustrating a display device according to an embodiment.

FIG. 2 is a plan view illustrating a display device according to an embodiment.

Referring to FIG. 2, the display device 10 may include a plurality of pixels arranged along a plurality of rows and columns in the display area DA. Each of the plurality of pixels may include an emission area LA defined by a pixel defining layer, and may emit light (e.g., light having a set or predetermined peak wavelength) through the emission area LA. For example, the display area DA of the display device 10 may include first to third emission areas LA1, LA2, and LA3. Each of the first to third emission areas LA1, LA2, and LA3 may be an area in which light generated from a light emitting element of the display device 10 is emitted to the outside of the display device 10.

The first to third emission areas LA1, LA2, and LA3 may emit light (e.g., light having a set or predetermined peak wavelength) to the outside of the display device 10. The first emission area LA1 may emit light of a first color, the second emission area LA2 may emit light of a second color, and the third emission area LA3 may emit light of a third color. For example, the first color light may be red light having a peak wavelength in the range from 610 nm to 650 nm, the second color light may be green light having a peak wavelength in the range from 510 nm to 550 nm, and the third color light may be blue light having a peak wavelength in the range from 440 nm to 480 nm, but the present disclosure is not limited thereto.

The first to third emission areas LA1, LA2, and LA3 may be sequentially arranged repetitively along the first direction (X-axis direction) in the display area DA. For example, the width of the first emission area LA1 in the first direction (X-axis direction) may be larger than the width of the second emission area LA2 in the first direction, and the width of the second emission area LA2 in the first direction may be larger than the width of the third emission area LA3 in the first direction. For another example, the width of the first emission area LA1 in the first direction (X-axis direction), the width of the second emission area LA2 in the first direction, and the width of the third emission area LA3 in the first direction may be substantially the same.

For example, the first emission area LA1 may be larger in size than the second emission area LA2, and the second emission area LA2 may be larger in size than the third emission area LA3. For another example, the first emission area LA1, the second emission area LA2, and the third emission area LA3 may be substantially the same in size.

The display area DA of the display device 10 may include a plurality of light blocking areas BA that surround the plurality of emission areas LA. For example, the display area DA may include first to third light blocking areas BA1, BA2, and BA3. The first to third light blocking areas BA1, BA2, and BA3 may be disposed at one side of the first to third emission areas LA1, LA2, and LA3, respectively, to prevent or substantially prevent the colored lights emitted through the first to third emission areas LA1, LA2, and LA3 from mixing with one another.

Figure 3:
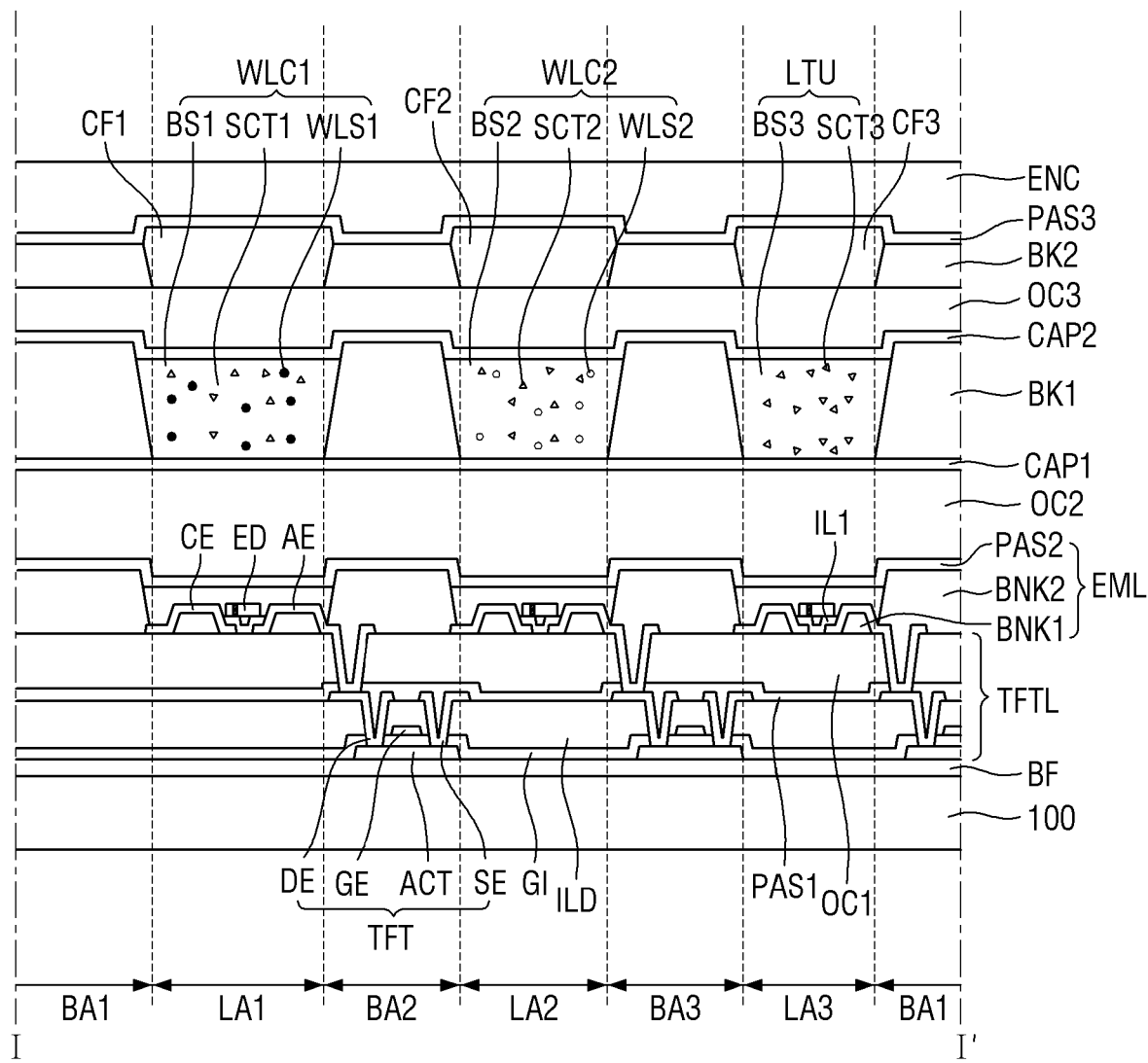
FIG. 3 is a cross-sectional view taken along the line I-I' of FIG. 2.

FIG. 3 is a cross-sectional view taken along the line I-I' of FIG. 2.

Referring to FIG. 3, the display area DA of the display device 10 may include first to third emission areas LA1, LA2, and LA3. Each of the first to third emission areas LA1, LA2, and LA3 may be an area in which light generated from a light emitting element of the display device 10 is emitted to the outside of the display device 10.

The display device 10 may include a substrate 100, a buffer layer BF, a thin film transistor layer TFTL, and a light emitting element layer EML.

The substrate 100 may be a base substrate or a base member, and may be made of an insulating material such as a polymer resin. For example, the substrate 100 may be a rigid substrate. When the substrate 100 is a rigid substrate, the substrate 100 may include a glass material or a metal material, but is not limited thereto. In another example, the substrate 100 may be a flexible substrate which may be bent, folded and rolled. When the substrate 100 is a flexible substrate, the substrate 100 may include polyimide (PI), but is not limited thereto.

The buffer layer BF may be disposed on the substrate 100. The buffer layer BF may be formed of an inorganic film that is capable of preventing or substantially preventing air or moisture infiltration into the display device 10. For example, the buffer layer BF may include a plurality of inorganic films laminated alternately.

The thin film transistor layer TFTL may include a thin film transistor TFT, a gate insulating layer GI, an interlayer insulating layer ILD, a first passivation layer PAS1, and a first planarization layer OC1.

The thin film transistor TFT may be disposed on the buffer layer BF, and may constitute a pixel circuit of each of a plurality of pixels. For example, the thin film transistor TFT may be a switching transistor or a driving transistor of the pixel circuit. The thin film transistor TFT may include a semiconductor layer ACT, a gate electrode GE, a source electrode SE, and a drain electrode DE.

The semiconductor layer ACT may be formed on the buffer layer BF. The semiconductor layer ACT may overlap the gate electrode GE, the source electrode SE, and the drain electrode DE. The semiconductor layer ACT may be in direct contact with the source electrode SE and the drain electrode DE and face (i.e., overlap with) the gate electrode GE with the gate insulating layer GI interposed therebetween.

The gate electrode GE may be disposed on the gate insulating layer GI. The gate electrode GE may overlap the semiconductor layer ACT with the gate insulating layer GI interposed therebetween. The interlayer insulating layer ILD may be disposed on the gate insulating layer GI and the gate electrode GE.

The source electrode SE and the drain electrode DE may be disposed to be spaced from each other on the interlayer insulating layer ILD. The source electrode SE may contact one end of the semiconductor layer ACT through a contact hole provided in the gate insulating layer GI and the interlayer dielectric layer ILD. The drain electrode DE may contact the other end of the semiconductor layer ACT through a contact hole provided in the gate insulating layer GI and the interlayer dielectric layer ILD. The first passivation layer PAS1 and the first planarization layer OC1 may be sequentially disposed on the source electrode SE and the drain electrode DE. The drain electrode DE may be connected to a first electrode AE of a light emitting member EL through a contact hole provided in the first passivation layer PAS1 and the first planarization layer OC1.

The gate insulating layer GI may be provided on the semiconductor layer ACT. For example, the gate insulating layer GI may be disposed on the semiconductor layer ACT and the buffer layer BF to insulate the gate electrode GE from the semiconductor layer ACT. The gate insulating layer GI may include a contact hole through which the source electrode SE passes and a contact hole through which the drain electrode DE passes.

The interlayer insulating layer ILD (e.g., an interlayer dielectric layer) may be disposed on the gate electrode GE. For example, the interlayer insulating layer ILD may include a contact hole through which the source electrode SE passes and a contact hole through which the drain electrode DE passes. Here, the contact holes of the interlayer insulating layer ILD may be connected to the corresponding contact holes of the gate insulating layer GI.

The first passivation layer PAS1 may be provided on the thin film transistor TFT to protect the thin film transistor TFT. For example, the first passivation layer PAS1 may include a contact hole through which the first electrode AE passes.

The first planarization layer OC1 may be provided on the first passivation layer PAS1 to planarize a top portion of the thin film transistor TFT. For example, the first planarization layer OC1 may include a contact hole through which the first electrode AE of the light emitting member EL passes. Here, the contact hole of the first planarization layer OC1 may be connected to the contact hole of the first passivation layer PAS1.

The light emitting element layer EML may include a light emitting member EL, a first bank BNK1, a second bank BNK2, and a second passivation layer PAS2.

The light emitting member EL may be provided above the thin film transistor TFT. The light emitting member EL may include a first electrode AE, a second electrode CE, and a light emitting element ED.

The first electrode AE may be provided on the first planarization layer OC1. For example, the first electrode AE may be disposed on the first bank BNK1 disposed on the first planarization layer OC1 to cover the first bank BNK1. The first electrode AE may be disposed to overlap one of the first to third emission areas LA1, LA2, and LA3 defined by the second bank BNK2. Further, the first electrode AE may be connected to the drain electrode DE of the thin film transistor TFT. The first electrode AE may be an anode electrode of the light emitting element ED, but is not limited thereto.

The second electrode CE may be provided on the first planarization layer OC1. For example, the second electrode CE may be disposed on the first bank BNK1 disposed on the first planarization layer OC1 to cover the first bank BNK1. The second electrode CE may be disposed to overlap one of the first to third emission areas LA1, LA2, and LA3 defined by the second bank BNK2. For example, the second electrode CE may receive a common voltage supplied to all pixels. The second electrode CE may be a cathode electrode of the light emitting element ED, but is not limited thereto.

A first insulating layer IL1 may cover a part of the first electrode AE and a part of the second electrode CE that are adjacent to each other, and may insulate the first electrode AE from the second electrode CE.

The light emitting element ED may be disposed between the first electrode AE and the second electrode CE on the first planarization layer OC1. The light emitting element ED may be disposed on the first insulating layer IL1. One end of the light emitting element ED may be connected to the first electrode AE, and the other end of the light emitting element ED may be connected to the second electrode CE. For example, a plurality of light emitting elements ED may include active layers having the same material and emit light of the same wavelength band or light of the same color. Light emitted from each of the first to third emission areas LA1, LA2, and LA3 may have the same color. For example, the plurality of light emitting elements ED may emit light of a third color or blue light having a peak wavelength in the range of 440 nm to 480 nm. Therefore, the light emitting element layer EML may emit the third color light or blue light.

The second bank BNK2 may be disposed on the first planarization layer OC1 to define the first to third emission areas LA1, LA2, and LA3. For example, the second bank BNK2 may surround each of the first to third emission areas LA1, LA2, and LA3, but is not limited thereto. The second bank BNK2 may separate and insulate the first electrode AE or the second electrode CE of each of a plurality of light emitting members EL. The second bank BNK2 may be disposed in the first to third light blocking areas BA1, BA2, and BA3.

The second passivation layer PAS2 may be disposed on the plurality of light emitting members EL and the second bank BNK2. The second passivation layer PAS2 may cover the plurality of light emitting members EL and may protect the plurality of light emitting members EL (e.g., may protect the plurality of light emitting members EL during the manufacturing process). The second passivation layer PAS2 may prevent or substantially prevent infiltration of impurities such as moisture or air from the outside to prevent or substantially prevent damage to the plurality of light emitting members EL.

The display device 10 may further include a second planarization layer OC2, a first capping layer CAP1, a first light blocking member BK1, a first wavelength conversion unit WLC1, a second wavelength conversion unit WLC2, and a light transmission unit LTU, a second capping layer CAP2, a third planarization layer OC3, a second light blocking member BK2, first to third color filters CF1, CF2, and CF3, a third passivation layer PAS3, and an encapsulation layer ENC.

The second planarization layer OC2 may be provided on the light emitting element layer EML to planarize a top portion of the light emitting element layer EML. The second planarization layer OC2 may include an organic material. For example, the second planarization layer OC2 may include at least one of acrylic resin, epoxy resin, phenolic resin, polyamide resin, or polyimide resin.

The first capping layer CAP1 may be disposed on the second planarization layer OC2. The first capping layer CAP1 may seal the bottom surfaces of the light transmission unit LTU and the first and second wavelength conversion units WLC1 and WLC2. The first capping layer CAP1 may contain an inorganic material. For example, the first capping layer CAP1 may contain at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The first light blocking member BK1 may be disposed in the first to third light blocking areas BA1, BA2, and BA3 on the first capping layer CAP1. The first light blocking member BK1 may overlap the second bank BNK2 in the thickness direction. The first light blocking member BK1 may block transmission of light. The first light blocking member BK1 may prevent or substantially prevent light infiltration and color mixture between the first to third emission areas LA1, LA2, and LA3, which leads to the improvement of color reproducibility. The first light blocking member BK1 may be arranged in the form of a grid surrounding the first to third emission areas LA1, LA2, and LA3 on the first capping layer CAP1 in a plan view.

The first light blocking member BK1 may include an organic light blocking material and a lyophobic component. Here, the lyophobic component may be formed of fluorine-containing monomer or fluorine-containing polymer and, in detail, may include fluorine-containing aliphatic polycarbonate. For example, the first light blocking member BK1 may be made of a black organic material including the lyophobic component. The first light blocking member BK1 may be formed through a coating and exposure process of an organic light blocking material including the lyophobic component.

By including the lyophobic component, the first light blocking member BK1 may separate the first and second wavelength conversion units WLC1 and WLC2 and the light transmission unit LTU into the corresponding emission areas LA. For example, in the case of forming the first and second wavelength conversion units WLC1 and WLC2 and the light transmission unit LTU in an inkjet manner, the ink compositions may slide on the top surface of the first light blocking member BK1. In this case, the first light blocking member BK1 containing the lyophobic component may allow the ink composition to slide down to the corresponding transmission areas. Therefore, the first light blocking member BK1 may prevent or substantially prevent the ink compositions from being mixed.

The first wavelength conversion unit WLC1 may be disposed in the first emission area LA1 on the first capping layer CAP1. The first wavelength conversion unit WLC1 may be surrounded by the first light blocking member BK1. The first wavelength conversion unit WLC1 may include a first based resin BS1, a first scatterer SCT1, and a first wavelength shifter WLS1.

The first base resin BS1 may contain a material having a relatively high light transmittance. The first base resin BS1 may be formed of a transparent organic material. For example, the first base resin BS1 may contain at least one of organic materials such as epoxy resin, acrylic resin, cardo resin, or imide resin.

The first scatterer SCT1 may have a refractive index different from that of the first base resin BS1 and form an optical interface with the first base resin BS1. For example, the first scatterer SCT1 may contain a light scattering material or light scattering particles that scatter at least a part of the transmitted light. For example, the first scatterer SCT1 may contain a metallic oxide such as titanium oxide ($TiO_2$), zirconium oxide ($ZrO_2$), aluminum oxide ($AL_2O_3$), indium oxide ($In_2O_3$), zinc oxide (ZnO), or tin oxide ($SnO_2$), or may contain organic particles such as acrylic resin and urethane resin. The first scatterer SCT1 may scatter light in random directions regardless of the incidence direction of the incident light without any substantial change of the peak wavelength of the incident light.

The first wavelength shifter WLS1 may change or shift the peak wavelength of the incident light to a first peak wavelength. For example, the first wavelength shifter WLS1 may convert blue light provided from the display device 10 into red light having a single peak wavelength in the range of 610 nm to 650 nm and emit the red light. The first wavelength shifter WLS1 may be a quantum dot, a quantum rod, or a fluorescent substance. The quantum dot may be a particulate material that emits light of a specific color when an electron transitions from a conduction band to a valence band.

For example, the quantum dot may be a semiconductor nanocrystal material. The quantum dot may have a specific band gap according to its composition and size. Thus, the quantum dot may absorb light and then emit light having an intrinsic wavelength. Examples of the semiconductor nanocrystal of the quantum dot may include a Group IV nanocrystal, a Group II-VI compound nanocrystal, a Group III-V compound nanocrystal, a Group IV-VI compound nanocrystal, and a combination thereof.

The Group II-VI compound may be selected from the group consisting of binary compounds, ternary compounds, and quaternary compounds, wherein the binary compounds are selected from the group consisting of CdSe, CdTe, ZnS, ZnSe, ZnTe, ZnO, HgS, HgSe, HgTe, MgSe, MgS and mixtures thereof, the ternary compounds are selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof, and the quaternary compounds are selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

The Group III-V compound may be selected from the group consisting of binary compounds, ternary compounds, and quaternary compounds, wherein the binary compounds are selected from the group consisting of GaN, GaP, GaAs, GaSb, AlN, AlP, AlAs, AlSb, InN, InP, InAs, InSb and mixtures thereof, the ternary compounds are selected from the group consisting of GaNP, GaNAs, GaNSb, GaPAs, GaPSb, AlNP, AlNAs, AlNSb, AlPAs, AlPSb, InGaP, InP, InAlP, InNAs, InNSb, InPAs, InPSb, GaAlNP and mixtures thereof, and the quaternary compounds are selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The Group IV-VI compound may be selected from the group consisting of binary compounds, ternary compounds, and quaternary compounds, wherein the binary compounds are selected from the group consisting of SnS, SnSe, SnTe, PbS, PbSe, PbTe and mixtures thereof, the ternary compounds are selected from the group consisting of SnSeS, SnSeTe, SnSTe, PbSeS, PbSeTe, PbSTe, SnPbS, SnPbSe, SnPbTe and mixtures thereof, and the quaternary compounds are selected from the group consisting of SnPbSSe, SnPbSeTe, SnPbSTe and mixtures thereof. The Group IV element may be selected from the group consisting of Si, Ge and mixtures thereof. The Group IV compound may be a binary compound selected from the group consisting of SiC, SiGe and mixtures thereof.

For example, the binary compound, the tertiary compound or the quaternary compound may exist in particles at a uniform concentration, or may exist in the same particle divided into states where concentration distributions are partially different.

For example, the quantum dot may have a core-shell structure including a core containing the aforementioned nanocrystal and a shell surrounding the core. The shell of the quantum dot may act as a protective layer for maintaining semiconductor characteristics by preventing chemical denaturation of the core and as a charging layer for giving electrophoretic characteristics to the quantum dot. The shell may be formed of a single layer or multiple layers. An interface between the core and the shell may have a concentration gradient in which the concentration of elements present in the shell decreases toward the center. The shell of the quantum dot may be formed of a metallic or nonmetallic oxide, a semiconductor compound, or a combination thereof.

For example, the metallic or nonmetallic oxide may include, but is not limited to, a binary compound such as $SiO_2$, $Al_2O_3$, $TiO_2$, ZnO, MnO, $Mn_3O_3$, $Mn_3O_4$, CuO, FeO, $Fe_3O_3$, $Fe_3O_4$, CoO, $Co_3O_4$ and NiO, or a tertiary compound such as $MgAl_2O_4$, $CoFe_2O_4$, $NiFe_2O_4$ and $CoMn_2O_4$.

In some embodiments, the semiconductor compound may include, but is not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb.

The light emitted from the first wavelength shifter WLS1 may have a full width of half maximum (FWHM) of the emission wavelength spectrum, which is 45 nm or less, 40 nm or less, or 30 nm or less. Thus, the purity and reproducibility of colors displayed by the display device 10 can be further improved. The light emitted by the first wavelength shifter WLS1 may be emitted in various directions regardless of the incidence direction of the incident light. This makes possible to improve lateral visibility of the red color displayed in the first emission area LA1.

A part of the blue light emitted from the light emitting element layer EML may pass through the first wavelength conversion unit WLC1 without being converted to red light by the first wavelength shifter WLS1. As a part of the blue light emitted from the light emitting element layer EML, the light incident on the first color filter CF1 without being converted by the first wavelength conversion unit WLC1 may be blocked by the first color filter CF1. In some embodiments, the red light produced by the first wavelength conversion unit WLC1 converting the blue light emitted from display device 10 may pass through the first color filter CF1 to be emitted to the outside. Accordingly, the red light is emitted through the first emission area LA1.

The second wavelength conversion unit WLC2 may be disposed in the second emission area LA2 on the first capping layer CAP1. The second wavelength conversion unit WLC2 may be surrounded by the first light blocking member BK1. The second wavelength conversion unit WLC2 may include a second base resin BS2, a second scatterer SCT2, and a second wavelength shifter WLS2.

The second base resin BS2 may contain a material having a relatively high light transmittance. The second base resin BS2 may be formed of a transparent organic material. For example, the second base resin BS2 may be made of the same material as the first base resin BS1, or may be made of the material exemplified in association with the first base resin BS1.

The second scatterer SCT2 may have a refractive index different from that of the second base resin BS2 and form an optical interface with the second base resin BS2. For example, the second scatterer SCT2 may contain a light scattering material or light scattering particles scattering at least a part of the transmitted light. For example, the second scatterer SCT2 may be made of the same material as the first scatterer SCT1, or may be made of the material exemplified in association with the first scatterer SCT1. The second scatterer SCT2 may scatter the light in random directions regardless of the incidence direction of the incident light without any substantial change of the peak wavelength of the incident light.

The second wavelength shifter WLS2 may change or shift the peak wavelength of the incident light to a second peak wavelength different from the first peak wavelength of the first wavelength shifter WLS1. For example, the second wavelength shifter WLS2 may convert blue light provided from the display device 10 into green light having a single peak wavelength in the range of 510 nm to 550 nm and emit the green light. The second wavelength shifter WLS2 may be a quantum dot, a quantum rod, or a fluorescent substance. The second wavelength shifter WLS2 may contain the materials identical in purpose with the materials enumerated in association with the first wavelength shifter WLS1. The second wavelength shifter WLS2 may be formed of a quantum dot, a quantum rod, or a fluorescent substance to have a wavelength conversion range different from that of the first wavelength shifter WLS1.

The light transmission unit LTU may be disposed in the third emission area LA3 on the first capping layer CAP1. The light transmission unit LTU may be surrounded by the first light blocking member BK1. The light transmission unit LTU may allow the incident light to pass therethrough while maintaining the peak wavelength of the light. The light transmission unit LTU may include a third base resin BS3 and a third scatterer SCT3.

The third base resin BS3 may contain a material having a relatively high light transmittance. The third base resin BS3 may be formed of a transparent organic material. For example, the third base resin BS3 may be made of the same material as the first base resin BS1 or the second base resin BS2, or may be made of the material exemplified in association with the first base resin BS1 or the second base resin BS2.

The third scatterer SCT3 may have a refractive index different from that of the third base resin BS3 and form an optical interface with the third base resin BS3. For example, the third scatterer SCT3 may contain a light scattering material or light scattering particles scattering at least a part of the transmitted light. For example, the third scatterer SCT3 may be formed of the same material as the first scatterer SCT1 or the second scatterer SCT2, or may be made of the material exemplified in association with the first scatterer SCT1 or the second scatterer SCT2. The third scatterer SCT3 may scatter the light in random directions regardless of the incidence direction of the incident light without any substantial change of the peak wavelength of the incident light.

Because the first and second wavelength conversion units WLC1 and WLC2 and the light transmission unit LTU are disposed on the light emitting element layer EML through the second planarization layer OC2 and the first capping layer CAP1, the display device 10 may not require a separate substrate for the first and second wavelength conversion units WLC1 and WLC2 and the light transmission unit LTU. Accordingly, the first and second wavelength conversion units WLC1 and WLC2 and the light transmission unit LTU may be easily aligned in the first to third emission areas LA1, LA2, and LA3, respectively, and the thickness of the display device 10 may be relatively reduced.

The second capping layer CAP2 may cover the first and second wavelength conversion units WLC1 and WLC2, the light transmission unit LTU, and the first light blocking member BK1. For example, the second capping layer CAP2 may seal the first and second wavelength conversion units WLC1 and WLC2 and the light transmission unit LTU to prevent or protect the first and second wavelength conversion units WLC1 and WLC2 and the light transmission unit LTU from damage or contamination. The second capping layer CAP2 may be made of the same material as the first capping layer CAP1, or may be made of the material exemplified in association with the first capping layer CAP1.

The third planarization layer OC3 may be disposed on the second capping layer CAP2 to planarize top portions of the first and second wavelength conversion units WLC1 and WLC2 and the light transmission unit LTU. The third planarization layer OC3 may include an organic material. For example, the third planarization layer OC3 may include at least one of acrylic resin, epoxy resin, phenolic resin, polyamide resin, or polyimide resin.

The second light blocking member BK2 may be disposed in the first to third light blocking areas BA1, BA2, and BA3 on the third planarization layer OC3. The second light blocking member BK2 may overlap the first light blocking member BK1 or the second bank BNK2 in the thickness direction. The second light blocking member BK2 may block transmission of light. The second light blocking member BK2 may prevent or substantially prevent light infiltration and color mixture between the first to third emission areas LA1, LA2, and LA3, which leads to the improvement of color reproducibility. The second light blocking member BK2 may be arranged in the form of a grid surrounding the first to third emission areas LA1, LA2, and LA3 in a plan view.

The first color filter CF1 may be disposed in the first emission area LA1 on the third planarization layer OC3. The first color filter CF1 may be surrounded by the second light blocking member BK2. The first color filter CF1 may overlap the first wavelength conversion unit WLC1 in the thickness direction. The first color filter CF1 may selectively allow the first color light (e.g., red light) to pass therethrough, and block or absorb the second color light (e.g., green light) and the third color light (e.g., blue light). For example, the first color filter CF1 may be a red color filter and contain a red colorant. The red colorant may include a red dye or a red pigment.

The second color filter CF2 may be disposed in the second emission area LA2 on the third planarization layer OC3. The second color filter CF2 may be surrounded by the second light blocking member BK2. The second color filter CF2 may overlap the second wavelength conversion unit WLC2 in the thickness direction. The second color filter CF2 may selectively allow the second color light (e.g., green light) to pass therethrough, and block or absorb the first color light (e.g., red light) and the third color light (e.g., blue light). For example, the second color filter CF2 may be a green color filter and contain a green colorant. The green colorant may include a green dye or a green pigment.

The third color filter CF3 may be disposed in the third emission area LA3 on the third planarization layer OC3. The third color filter CF3 may be surrounded by the second light blocking member BK2. The third color filter CF3 may overlap the light transmission unit LTU in the thickness direction. The third color filter CF3 may selectively allow the third color light (e.g., blue light) to pass therethrough, and block or absorb the first color light (e.g., red light) and the second color light (e.g., green light). For example, the third color filter CF3 may be a blue color filter and contain a blue colorant. The blue colorant may include a blue dye or a blue pigment.

The first to third color filters CF1, CF2, and CF3 may absorb a part of the light coming from the outside of the display device 10 to reduce the reflected light of the external light. This means that the first to third color filters CF1, CF2, and CF3 can prevent color distortion caused by the reflection of the external light.

Because the first to third color filters CF1, CF2, and CF3 are disposed on the first and second wavelength conversion units WLC1 and WLC2 and the light transmission unit LTU through the third planarization layer OC3 and the second capping layer CAP2, the display device 10 may not require a separate substrate for the first to third color filters CF1, CF2, and CF3. Therefore, the thickness of the display device 10 may be relatively reduced.

The third passivation layer PAS3 may cover the first to third color filters CF1, CF2, and CF3. The third passivation layer PAS3 may protect the first to third color filters CF1, CF2, and CF3.

The encapsulation layer ENC may be disposed on the third passivation layer PAS3. For example, the encapsulation layer ENC may include at least one inorganic film to prevent or substantially prevent permeation of oxygen or moisture. In some embodiments, the encapsulation layer ENC may include at least one organic film to protect the display device 10 from foreign substances such as dust.

Figure 4:
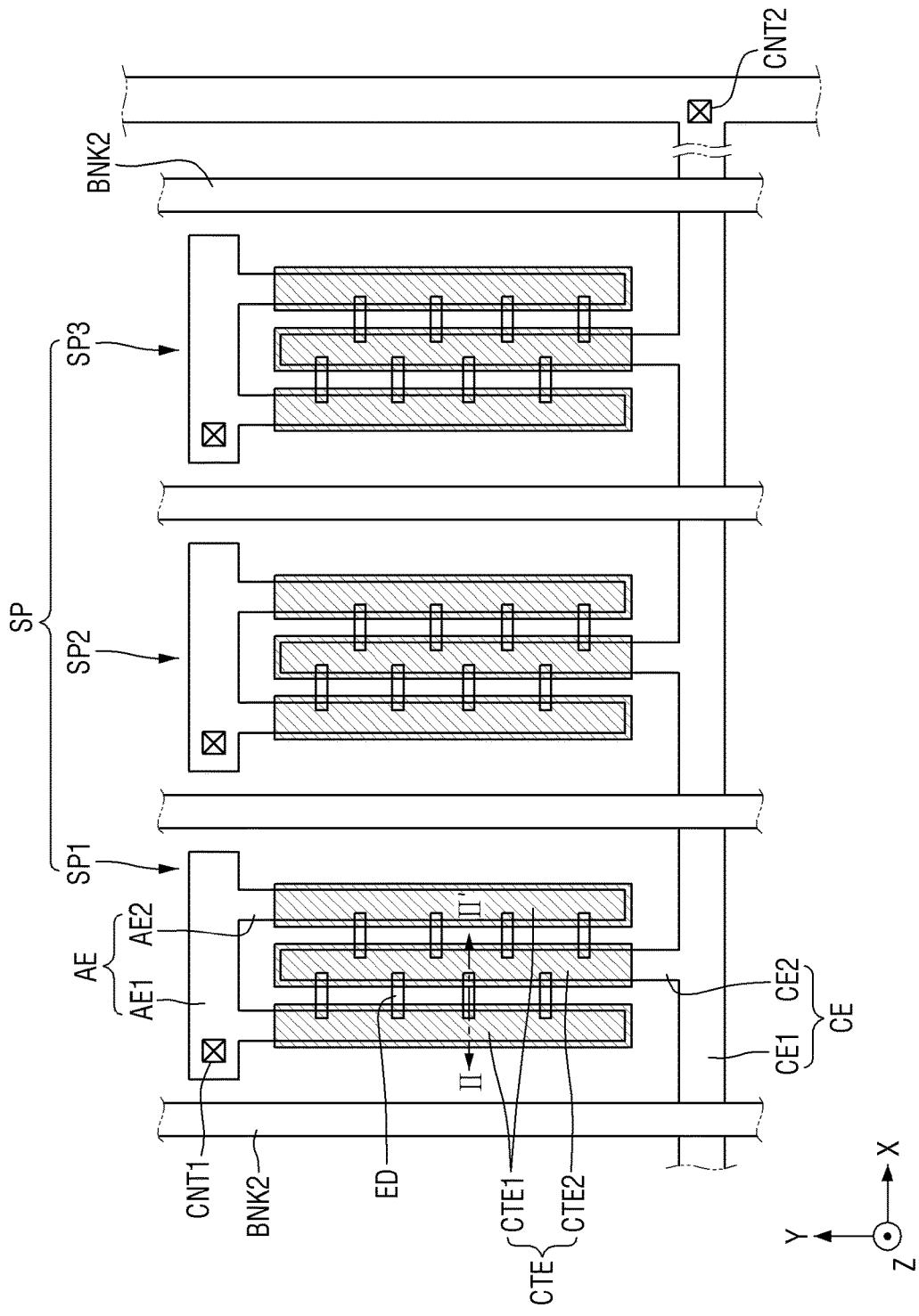
FIG. 4 is a plan view illustrating a pixel of a display device according to an embodiment.

FIG. 4 is a plan view illustrating a pixel of a display device according to an embodiment.

Referring to FIG. 4, each of the plurality of pixels SP may include first to third sub-pixels SP1, SP2, and SP3. The first to third sub-pixels SP1, SP2, and SP3 may correspond to the first to third emission areas LA1, LA2, and LA3, respectively. The light emitting elements ED of the first to third sub-pixels SP1, SP2, and SP3 may emit light through the first to third emission areas LA1, LA2, and LA3, respectively.

Each of the first to third sub-pixels SP1, SP2, and SP3 may emit light of the same color. For example, the first to third sub-pixels SP1, SP2, and SP3 may include the same type of the light emitting elements ED, and may emit light of a third color or blue light. For another example, the first sub-pixel SP1 may emit light of a first color such as red light, the second sub-pixel SP2 may emit light of a second color such as green light, and the third sub-pixel SP3 may emit light of a third color such as blue light.

Each of the first to third sub-pixels SP1, SP2, and SP3 may include first and second electrodes AE and CE, one or more light emitting elements ED, a plurality of contact electrodes CTE, and a plurality of second banks BNK2.

The first and second electrodes AE and CE may be electrically connected to the light emitting element ED to be applied with a voltage (e.g., a set or predetermined voltage, and the light emitting element ED may emit light in a specific wavelength band. At least a part of the first and second electrodes AE and CE may form an electric field in the pixel SP, and the light emitting element ED may be aligned by the electric field.

For example, the first electrode AE may be a pixel electrode separated for each of the first to third sub-pixels SP1, SP2, and SP3, and the second electrode CE may be a common electrode commonly connected to the first to third sub-pixels SP1, SP2 and SP3. One of the first electrode AE and the second electrode CE may be an anode electrode of the light emitting element ED, and the other may be a cathode electrode of the light emitting element ED.

The first electrode AE may include a first electrode stem AE1 extending in the first direction (X-axis direction), and at least one first electrode branch AE2 branched from the first electrode stem AE1 and extending in the second direction (Y-axis direction).

The first electrode stem AE1 of each of the first to third sub-pixels SP1, SP2, and SP3 may be spaced from the first electrode stem AE1 of the adjacent sub-pixel, and the first electrode stems AE1 of the sub-pixels adjacent in the first direction (X-axis direction) may be disposed on an imaginary extension line. The respective first electrode stems AE1 of the first to third sub-pixels SP1, SP2, and SP3 may receive different signals and may be independently driven.

The first electrode branch AE2 may be branched from the first electrode stem AE1 and extend in the second direction (Y-axis direction). One end of the first electrode branch AE2 may be connected to the first electrode stem AE1, and the other end of the first electrode branch AE2 may be spaced from a second electrode stem CE1 facing the first electrode stem AE1.

The second electrode CE may include the second electrode stem CE1 extending in the first direction (X-axis direction), and a second electrode branch CE2 branched from the second electrode stem CE1 and extending in the second direction (Y-axis direction). The second electrode stem CE1 of each of the first to third sub-pixels SP1, SP2, and SP3 may be connected to the second electrode stem CE1 of the adjacent sub-pixel. The second electrode stem CE1 may extend in the first direction (X-axis direction) to traverse the plurality of pixels SP. The second electrode stem CE1 may be connected to an outer portion of the display area DA or a portion extending in one direction from the non-display area NDA.

The second electrode branch CE2 may be spaced from and face the first electrode branch AE2. One end of the second electrode branch CE2 may be connected to the second electrode stem CE1, and the other end of the second electrode branch CE2 may be spaced from the first electrode stem AE1.

The first electrode AE may be electrically connected to the thin film transistor layer TFTL of the display device 10 through a first contact hole CNT1, and the second electrode CE may be electrically connected to the thin film transistor layer TFTL of the display device 10 through a second contact hole CNT2. For example, the first contact hole CNT1 may be disposed in each of the plurality of first electrode stems AE1, and the second contact hole CNT2 may be disposed in the second electrode stem CE1, but the present disclosure is not limited thereto.

The second bank BNK2 may be disposed at a boundary between the plurality of pixels SP. The plurality of first electrode stems AE1 may be spaced from each other with respect to the second bank BNK2. The second bank BNK2 may extend in the second direction (Y-axis direction), and may be disposed at the boundary of the pixels SP (or the adjacent subpixels SP1, SP2, SP3) arranged along the first direction (X-axis direction). In some embodiments, the second bank BNK2 may also be disposed at the boundary of the pixels SP (or at the boundary of the subpixels SP1, SP2, SP3) arranged along the second direction (Y-axis direction). The second bank BNK2 may define a boundary between the plurality of pixels SP (or the adjacent subpixels SP1, SP2, SP3).

During the manufacturing of the display device 10, the second bank BNK2 may prevent or substantially prevent ink from crossing the boundary of the pixels SP when spraying the ink in which the light emitting elements ED are dispersed. The second bank BNK2 may separate inks in which different light emitting elements ED are dispersed such that the inks are not mixed with each other.

The light emitting elements ED may be disposed between the first electrode AE and the second electrode CE. One end of the light emitting element ED may be connected to the first electrode AE, and the other end of the light emitting element ED may be connected to the second electrode CE. For example, the light emitting element ED may be connected to the first electrode AE through a first contact electrode CTE1, and may be connected to the second electrode CE through a second contact electrode CTE2.

The light emitting elements ED may be disposed to be spaced from each other, and may be arranged to be substantially parallel to each other. The distance between the light emitting elements ED is not particularly limited. Some of the light emitting elements ED may be disposed adjacent to each other, others may be spaced from each other at regular intervals, and the others may be aligned in a specific direction with a non-uniform density. For example, each of the light emitting elements ED may be disposed in a direction perpendicular to a direction in which the first electrode branch AE2 or the second electrode branch CE2 extends. For example, each of the light emitting elements ED may be disposed in a direction oblique to the extension direction of the first electrode branch AE2 or the second electrode branch CE2.

The light emitting elements ED may include active layers containing the same material to emit light in the same wavelength band or light of the same color. The first to third sub-pixels SP1, SP2, and SP3 may emit light of the same color. For example, the plurality of light emitting elements ED may emit light of a third color or blue light having a peak wavelength in the range of 440 nm to 480 nm. Therefore, the light emitting element layer EML of the display device 10 may emit the third color light or blue light. For example, the first to third sub-pixels SP1, SP2, and SP3 may include the light emitting elements ED having different active layers to emit light of different colors.

The contact electrode CTE may include first and second contact electrodes CTE1 and CTE2. The first contact electrode CTE1 may cover a part of the light emitting element ED and the first electrode branch AE2, and may electrically connect the first electrode branch AE2 to the light emitting element ED. The second contact electrode CTE2 may cover another part of the light emitting element ED and the second electrode branch CE2, and may electrically connect the second electrode branch CE2 to the light emitting element ED.

The first contact electrode CTE1 may be disposed on the first electrode branch AE2 to extend in the second direction (Y-axis direction). The first contact electrode CTE1 may be in contact with one end of the light emitting element ED. The light emitting element ED may be electrically connected to the first electrode AE through the first contact electrode CTE1.

The second contact electrode CTE2 may be disposed on the second electrode branch CE2 to extend in the second direction (Y-axis direction). The second contact electrode CTE2 may be spaced from the first contact electrode CTE1 in the first direction (X-axis direction). The second contact electrode CTE2 may be in contact with the other end of the light emitting element ED. The light emitting element ED may be electrically connected to the second electrode CE through the second contact electrode CTE2.

For example, the width of each of the first and second contact electrodes CTE1 and CTE2 may be greater than the width of each of the first and second electrode branches AE2 and CE2. For example, each of the first and second contact electrodes CTE1 and CTE2 may cover one side of each of the first and second electrode branches AE2 and CE2.

Figure 5:
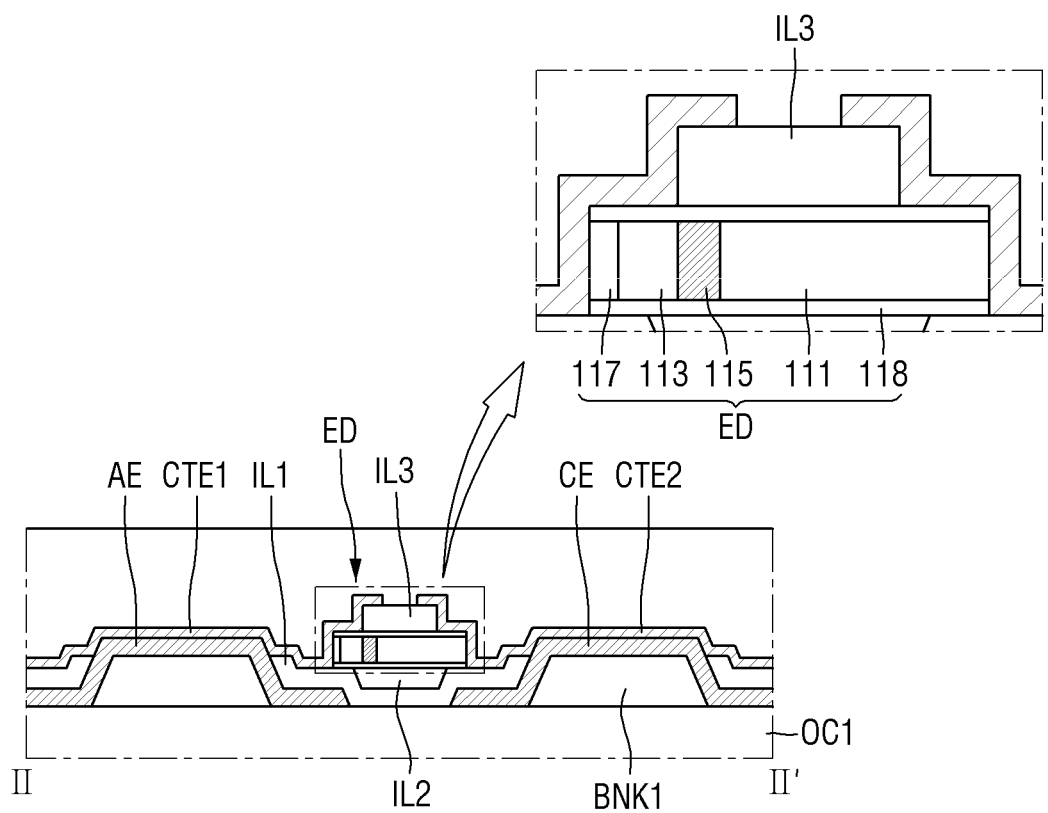
FIG. 5 is a cross-sectional view taken along the line II-II' of FIG. 4.

FIG. 5 is a cross-sectional view taken along the line II-II' of FIG. 4.

Referring to FIG. 5, the light emitting element layer EML of the display device 10 may be disposed on the thin film transistor layer TFTL, and may include first to third insulating layers IL1, IL2, and IL3.

The plurality of first banks BNK1 may be disposed in each of the first to third emission areas LA1, LA2, and LA3. Each of the first banks BNK1 may correspond to the first electrode AE or the second electrode CE. Each of the first and second electrodes AE and CE may be disposed on the corresponding first bank BNK1. For example, each of the first and second electrode branches AE2 and CE2 may be disposed on the corresponding first bank BNK1. The first bank BNK1 may include polyimide (PI), but is not limited thereto.

The plurality of first banks BNK1 may be disposed on the first planarization layer OC1, and the side surface of each of the plurality of first banks BNK1 may be inclined from the first planarization layer OC1. The inclined surface of the first bank BNK1 may reflect the light emitted from the light emitting element ED. For example, each of the first and second electrodes AE and CE may include a material having high reflectivity and may be disposed on the inclined surface of the first bank BNK1 to reflect the light emitted from the light emitting element ED in the upward direction of the display device 10.

Referring to FIG. 5 in conjunction with FIG. 4, the first electrode stem AE1 may include the first contact hole CNT1 penetrating through the first planarization layer OC1. The first electrode stem AE1 may be electrically connected to the thin film transistor TFT through the first contact hole CNT1. Accordingly, the first electrode AE may receive an electrical signal (e.g., a set or predetermined electrical signal) from the thin film transistor TFT.

The second electrode stem CE1 may extend in the first direction (X-axis direction) and may also be disposed in a non-emission area where the light emitting element ED is not disposed. The second electrode stem CE1 may include the second contact hole CNT2 penetrating the first planarization layer OC1. The second electrode stem CE1 may be electrically connected to a power electrode through the second contact hole CNT2. The second electrode CE may receive an electrical signal (e.g., a set or a predetermined electrical signal) from the power electrode.

The first and second electrodes AE and CE may include a transparent conductive material. For example, each of the first and second electrodes AE and CE may include at least one of indium tin oxide (ITO), indium zinc oxide (IZO), or indium tin zinc oxide (ITZO), but is not limited thereto.

The first and second electrodes AE and CE may include a conductive material having high reflectivity. For example, the first and second electrodes AE and CE may include a metal such as silver (Ag), copper (Cu), or aluminum (Al) having high reflectivity. The first and second electrodes AE and CE may reflect light incident from the light emitting element ED to the top of the display device 10.

The first and second electrodes AE and CE may have a structure in which one or more layers of a transparent conductive material and a metal having high reflectivity are stacked, or may be formed as a single layer including them. For example, the first and second electrodes AE and CE have a stacked structure of ITO/silver (Ag)/ITO/IZO, or may be an alloy including aluminum (Al), nickel (Ni), lanthanum (La), and the like, but are not limited thereto.

The first insulating layer IL1 may be disposed on the first planarization layer OC1, the first electrode AE, and the second electrode CE. The first insulating layer IL1 may cover a part of each of the first and second electrodes AE and CE. For example, the first insulating layer IL1 may expose a portion of the first and second electrodes AE and CE corresponding to the top surface of the first bank BNK1, and may cover a portion of the first and second electrodes AE and CE that does not correspond to the top surface thereof. Accordingly, the first insulating layer IL1 may include an opening exposing a portion of the first and second electrodes AE and CE corresponding to the top surface of the first bank BNK1.

For example, the first insulating layer IL1 may include an inorganic insulating material, and may include a stepped portion recessed between the first and second electrodes AE and CE. The second insulating layer IL2 may fill the recessed stepped portion of the first insulating layer IL1. Therefore, the second insulating layer IL2 may planarize the top surface of the first insulating layer IL1, and the light emitting element ED may be disposed on the first and second insulating layers IL1 and IL2.

The first insulating layer IL1 may protect the first and second electrodes AE and CE, and may insulate the first and second electrodes AE and CE from each other. The first insulating layer IL1 may prevent the light emitting element ED from being damaged by direct contact with other members.

The light emitting element ED may be disposed between the first electrode AE and the second electrode CE on the first and second insulating layers IL1 and IL2. One end of the light emitting element ED may be connected to the first electrode AE, and the other end of the light emitting element ED may be connected to the second electrode CE. For example, the light emitting element ED may be connected to the first electrode AE through the first contact electrode CTE1, and may be connected to the second electrode CE through the second contact electrode CTE2.

The third insulating layer IL3 may be partially disposed on the light emitting element ED disposed between the first and second electrodes AE and CE. The third insulating layer IL3 may partially surround the outer surface of the light emitting element ED. The third insulating layer IL3 may protect the light emitting element ED. The third insulating layer IL3 may surround the outer surface of the light emitting element ED.

The contact electrode CTE may include first and second contact electrodes CTE1 and CTE2. The first contact electrode CTE1 may cover a part of the first electrode branch AE2 and the light emitting element ED, and may electrically connect the first electrode branch AE2 to the light emitting element ED. The second contact electrode CTE2 may cover another part of the light emitting element ED and the second electrode branch CE2, and may electrically connect the second electrode branch CE2 to the light emitting element ED.

The first contact electrode CTE1 may be disposed on the first electrode branch AE2 to extend in the second direction (Y-axis direction). The first contact electrode CTE1 may be in contact with one end of the light emitting element ED. The light emitting element ED may be electrically connected to the first electrode AE through the first contact electrode CTE1.

The second contact electrode CTE2 may be disposed on the second electrode branch CE2 to extend in the second direction (Y-axis direction). The second contact electrode CTE2 may be spaced from the first contact electrode CTE1 in the first direction (X-axis direction). The second contact electrode CTE2 may be in contact with the other end of the light emitting element ED. The light emitting element ED may be electrically connected to the second electrode CE through the second contact electrode CTE2.

The contact electrode CTE may include a conductive material. For example, the contact electrode CTE may include ITO, IZO, ITZO, aluminum (Al), or the like, but is not limited thereto.

Figure 6:
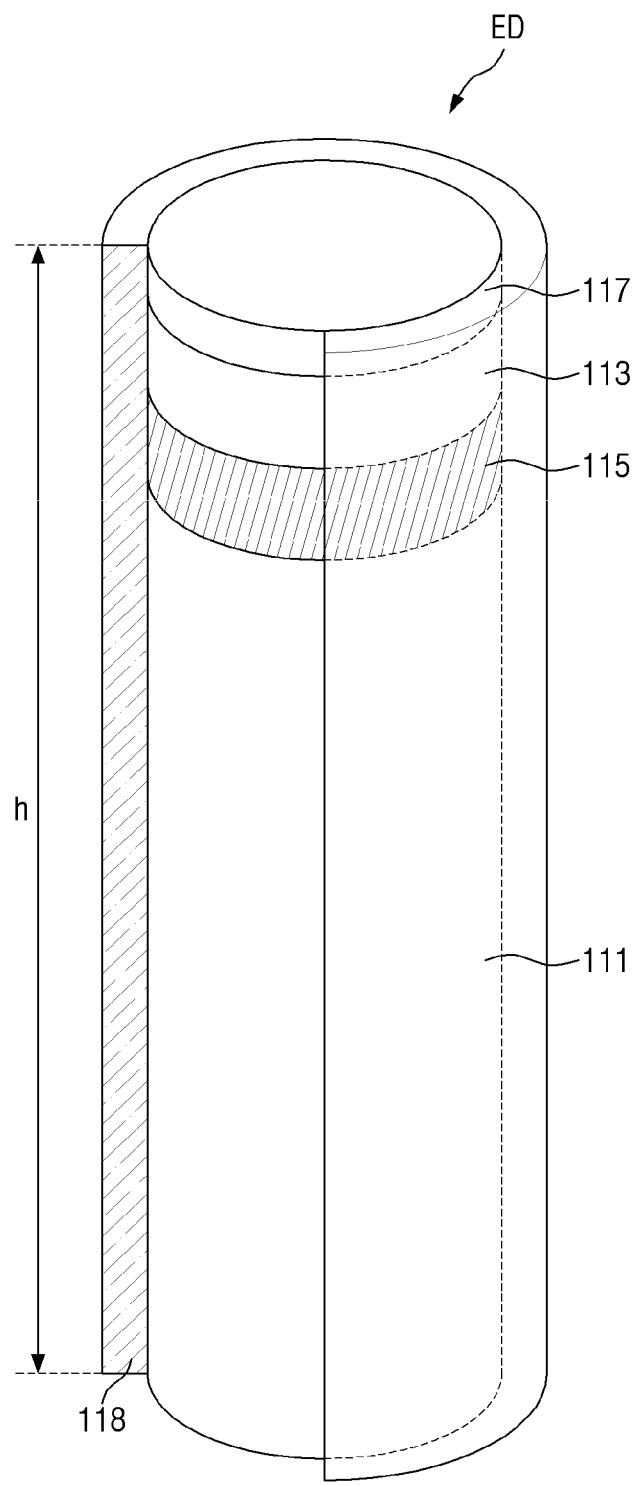
FIG. 6 is a schematic cutaway view showing a light emitting element according to an embodiment.

FIG. 6 is a schematic cutaway view showing a light emitting element according to an embodiment.

Referring to FIG. 6, the light emitting element ED may be a light emitting diode. For example, the light emitting element ED may have a micro-meter or nano-meter size, and may be an inorganic light emitting diode including an inorganic material. The inorganic light emitting diode may be aligned between two electrodes AE and CE that face each other by an electric field formed in a specific direction between the two electrodes.

The light emitting element ED may have a shape extending in one direction. The light emitting element ED may have a shape of a rod, wire, tube, or the like. For example, the light emitting element ED may have a cylindrical or rod shape. For another example, the light emitting element ED may have a polygonal prism shape such as a regular cube, a rectangular parallelepiped and a hexagonal prism, or may have various shapes such as a partially inclined shape elongated in one direction. A plurality of semiconductors of the light emitting element ED may have a structure in which they are sequentially arranged or stacked along one direction.

The light emitting element ED may include a first semiconductor layer 111, a second semiconductor layer 113, an active layer 115, an electrode layer 117, and an insulating layer 118.

The first semiconductor layer 111 may be an n-type semiconductor. For example, when the light emitting element ED emits blue light, the first semiconductor layer 111 may include a semiconductor material having a chemical formula of $Al_xGa_yIn_{1-x-y}N$ ($0 \leq x \leq 1$, $0 \leq y \leq 1$, $0 \leq x+y \leq 1$). The first semiconductor layer 111 may include at least one semiconductor material of n-type doped AlGaInN, GaN, AlGaN, InGaN, AlN, or InN. The first semiconductor layer 111 may be doped with an n-type dopant such as Si, Ge, or Sn. The first semiconductor layer 111 may be n-type Si-doped n-GaN. The length of the first semiconductor layer 111 may have a range of 1.5 μm to 5 μm, but is not limited thereto.

The second semiconductor layer 113 may be disposed on the active layer 115. For example, when the light emitting element ED emits blue or green light, the second semiconductor layer 113 may include a semiconductor material having a chemical formula of AlxGayIn1−x−yN ($0 \leq x \leq 1$, $0 \leq y \leq 1$, $0 \leq x+y \leq 1$). For example, the second semiconductor layer 113 may include at least one semiconductor material of p-type doped AlGaInN, GaN, AlGaN, InGaN, AlN, or InN. The second semiconductor layer 113 may be doped with a p-type dopant such as Mg, Zn, Ca, Se, or Ba. The second semiconductor layer 113 may be p-type Mg-doped p-GaN. The length of the second semiconductor layer 113 may have a range of 0.05 μm to 0.10 μm, but is not limited thereto.

Each of the first and second semiconductor layers 111 and 113 may be formed as a single layer, but is not limited thereto. For example, each of the first and second semiconductor layers 111 and 113 may further include a cladding layer or a tensile strain barrier reducing (TSBR) layer to be formed to have a multilayer structure.

The active layer 115 may be disposed between the first and second semiconductor layers 111 and 113. The active layer 115 may include a material having a single or multiple quantum well structure. When the active layer 115 includes a material having a multiple quantum well structure, a plurality of quantum layers and well layers may be stacked alternately. The active layer 115 may emit light by coupling of electron-hole pairs according to an electrical signal applied through the first and second semiconductor layers 111 and 113. For example, when the active layer 115 emits blue light, it may include a material such as AlGaN or AlGaInN. When the active layer 115 has a multiple quantum well structure in which quantum layers and well layers are alternately stacked, the quantum layer may include a material such as AlGaN or AlGaInN, and the well layer may include a material such as GaN or AlInN. The active layer 115 may include AlGaInN as the quantum layer and AlInN as the well layer to emit blue light.

As another example, the active layer 115 may have a structure in which semiconductor materials having large band gap energy and semiconductor materials having small band gap energy are alternately stacked, and may include Group III to V semiconductor materials according to the wavelength band of the emitted light. The light emitted by the active layer 115 is not limited to blue light, and the active layer 115 may emit red or green light in some cases. The length of the active layer 115 may have a range of 0.05 μm to 0.10 μm, but is not limited thereto.

Light emitted from the active layer 115 may be emitted in the longitudinal direction of the light emitting element ED, and may also be emitted from both side surfaces. The directionality of the light emitted from the active layer 115 may not be limited.

The electrode layer 117 may be an ohmic contact electrode. As another example, the electrode layer 117 may be a Schottky contact electrode. The light emitting element ED may include at least one electrode layer 117. When the light emitting device ED is electrically connected to the electrode or the contact electrode CTE, the electrode layer 117 may reduce resistance between the light emitting device ED and the electrode or contact electrode CTE. The electrode layer 117 may contain a conductive metal. For example, the electrode layer 117 may include at least one of aluminum (Al), titanium (Ti), indium (In), gold (Au), silver (Ag), indium tin oxide (ITO), indium zinc oxide (IZO), or indium tin zinc oxide (ITZO). The electrode layer 117 may include an n-type or p-type doped semiconductor material.

The insulating layer 118 may surround the outer surfaces (e.g., the outer peripheral surfaces) of the plurality of semiconductor layers 111, 113, the active layer 115, and electrode layers 117. The insulating layer 118 may surround the outer surface (e.g., the outer peripheral surface) of the active layer 115, and may extend in the extension direction of the light emitting element ED. The insulating layer 118 may protect the light emitting element ED. For example, the insulating layer 118 may surround the side surface of the light emitting element ED, and may expose the both ends including the electrode layers 117 of the light emitting element ED in the longitudinal direction.

The insulating layer 118 may include materials having insulating properties, for example, silicon oxide (SiOx), silicon nitride (SiNx), silicon oxynitride (SiOxNy), aluminum nitride (AlN), aluminum oxide ($A_2O_3$), and the like. Accordingly, the insulating layer 118 may prevent an electrical short circuit that may occur when the active layer 115 is in direct contact with the electrode through which the electrical signal is transmitted to the light emitting element ED. In some embodiments, the insulating layer 118 protects the outer surface of the light-emitting element ED including the active layer 115, thereby preventing or reducing a decrease in light emission efficiency.

The outer surface of the insulating layer 118 may be surface-treated. When the display device 10 is manufactured, the light emitting elements ED may be aligned by being sprayed on the electrodes in a state of being dispersed in an ink (e.g., a set or predetermined ink) or solution. The surface of the insulating layer 118 may be subjected to a hydrophobic or hydrophilic treatment, so that the light emitting element ED can maintain a dispersed state without being aggregated with other adjacent light emitting elements ED in the ink.

Figure 7:
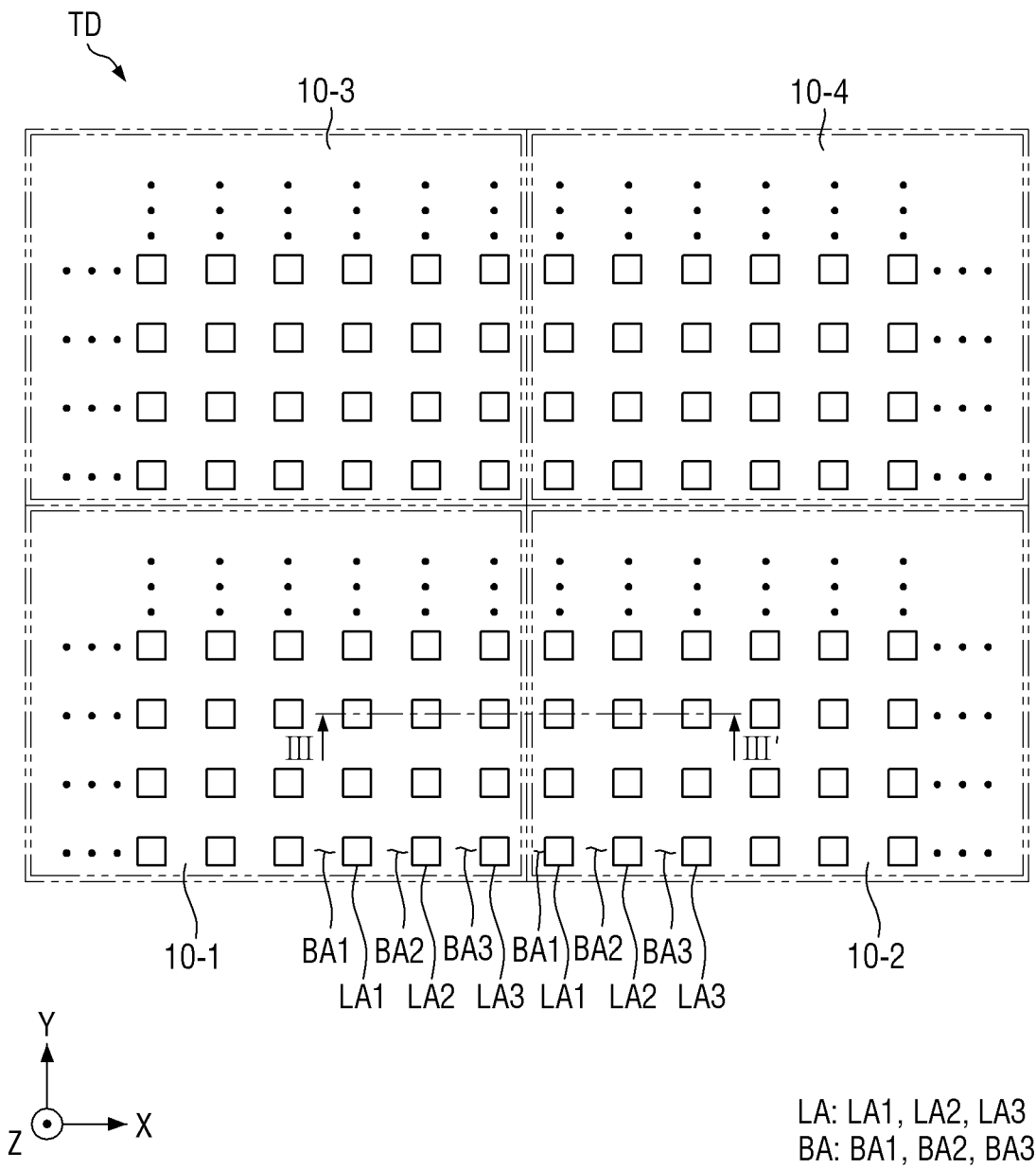
FIG. 7 is a plan view illustrating a bonding structure of a tiled display device according to an embodiment.
Figure 8:
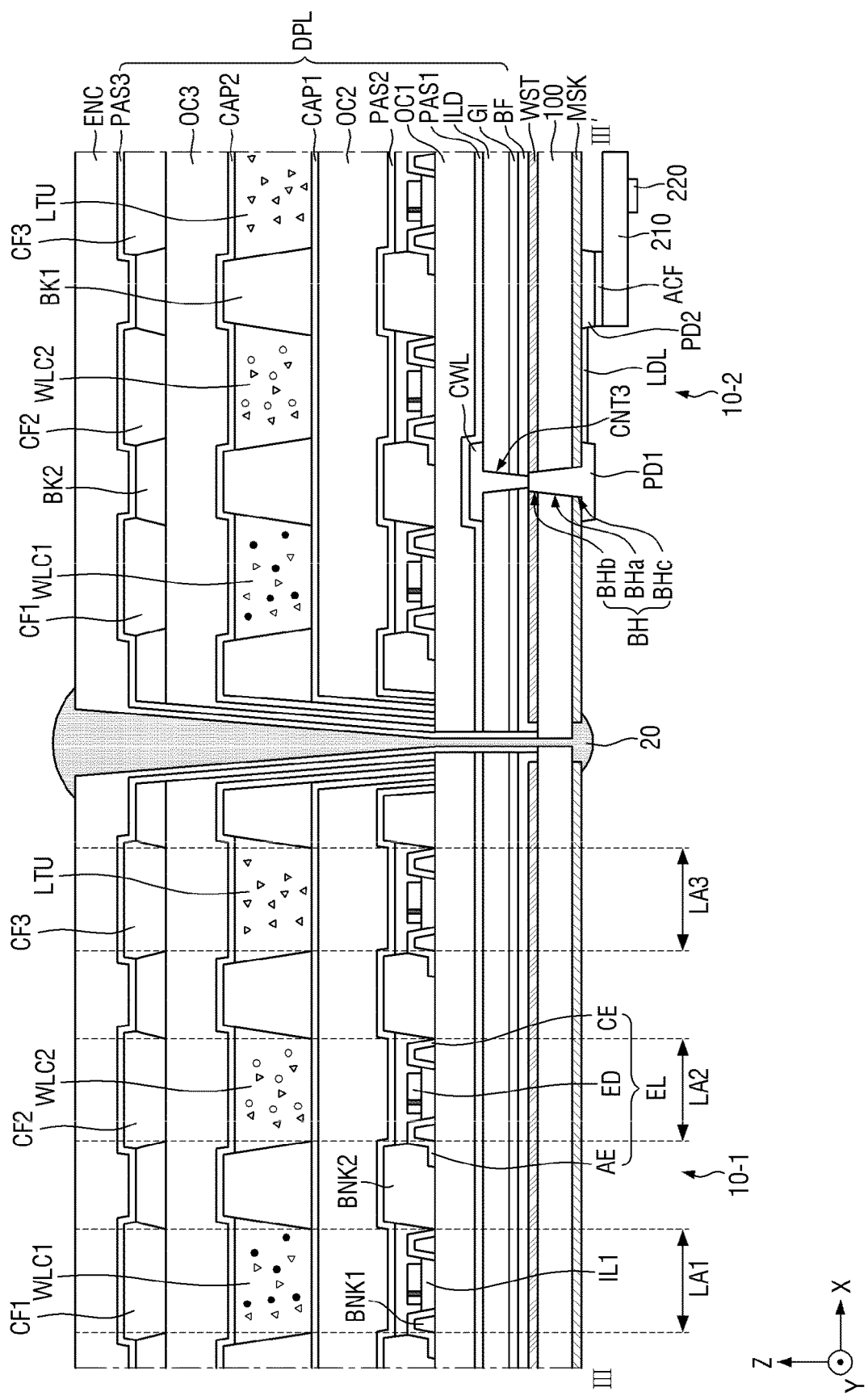
FIG. 8 is a cross-sectional view taken along the line III-III' of FIG. 7.

FIG. 7 is a plan view illustrating a bonding structure of a tiled display device according to an embodiment. FIG. 8 is a cross-sectional view taken along the line III-III' of FIG. 7. Hereinafter, the same configuration as the above-described configuration will be briefly described, or a description thereof will be omitted.

Referring to FIGS. 7 and 8, the tiled display device TD may include a plurality of display devices 10 and a coupling member 20 for bonding the plurality of display devices 10. For example, the tiled display device TD may include first to fourth display devices 10-1 to 10-4, but the number of the display devices 10 is not limited to that illustrated in the embodiment of FIG. 7. The number of the display devices 10 may be determined according to the size of each of the display devices 10 and the tiled display device TD.

The tiled display device TD may bond the side surfaces of the adjacent display devices 10 to each other by using the coupling member 20 disposed between the plurality of display devices 10. The coupling member 20 may connect the side surfaces of the first to fourth display devices 10-1 to 10-4 arranged in a grid form to implement the tiled display device TD. The coupling member 20 may bond the side surfaces of the substrate 100, the display layer DPL, and the encapsulation layer ENC of each of the display devices 10 adjacent to each other. In FIG. 8, the coupling member 20 may bond the side surfaces of the encapsulation layer ENC of the first and second display devices 10-1 and 10-2, the side surface of the substrate 100, the side surfaces of the display layer DPL of the first and second display devices 10-1 and 10-2, and the side surface of a mask portion MSK of the insulating layer.

For example, the coupling member 20 may be made of an adhesive or a double-sided tape having a relatively thin thickness to reduce or minimize the gap between the plurality of display devices 10. For another example, the coupling member 20 may be formed of a bonding frame having a relatively thin thickness to reduce or minimize the gap between the plurality of display devices 10. Accordingly, in the tiled display device TD, it is possible to prevent or substantially prevent the user from recognizing the boundary portions or the non-display areas NDA between the plurality of display devices 10.

The display device 10 may include the substrate 100, an etching stopper WST, a display layer DPL, the encapsulation layer ENC, and the mask portion MSK of the insulating layer.

The substrate 100 may be a base substrate or a base member, and may be made of an insulating material such as a polymer resin. For example, the substrate 100 may be a rigid substrate. When the substrate 100 is a rigid substrate, the substrate 100 may include a glass material or a metal material, but is not limited thereto. In another example, the substrate 100 may be a flexible substrate which can be bent, folded and rolled. When the substrate 100 is a flexible substrate, the substrate 100 may include polyimide (PI), but is not limited thereto.

A first portion BHa of a through hole BH may be formed to pass through the substrate 100. The first portion BHa of the through hole BH may be disposed in the display area DA of the substrate 100. For example, the first portion BHa of the through hole BH may overlap the plurality of light blocking areas BA in the thickness direction. For another example, the first portion BHa of the through hole BH may overlap the plurality of emission areas LA in the thickness direction. The first portion BHa of the through hole BH may be connected to a second portion BHb of the through hole BH formed in the etching stopper WST, and a third portion BHc of the through hole BH formed in the mask portion MSK of the insulating layer.

The etching stopper WST may be disposed on the top surface of the substrate 100. The etching stopper WST may be disposed between the substrate 100 and the display layer DPL. For example, the etching stopper WST may be disposed on the entire surface of the display area DA of the substrate 100. For another example, the etching stopper WST may be disposed in a region of the display area DA of the substrate 100, which corresponds to the through hole BH. The second portion BHb of the through hole BH may be formed to pass through the etching stopper WST. The second portion BHb of the through hole BH may be connected to the first portion BHa of the through hole BH formed in the substrate 100, and the third portion BHc of the through hole BH formed in the mask portion MSK of the insulating layer.

The etching stopper WST may include an inorganic insulating material or an organic insulating material. For example, the etching stopper WST may contain at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. For another example, the etching stopper WST may include at least one of acrylic resin, epoxy resin, phenolic resin, polyamide resin, or polyimide resin. The etching stopper WST may prevent diffusion of an etching solution to the display layer DPL in a process of forming the first portion BHa of the through hole BH penetrating the substrate 100.

The display layer DPL may be disposed on the etching stopper WST. The display layer DPL may include the buffer layer BF, the thin film transistor layer TFTL, the light emitting element layer EML, the second planarization layer OC2, the first capping layer CAP1, and the first light blocking member BK1, the first wavelength conversion unit WLC1, the second wavelength conversion unit WLC2, the light transmission unit LTU, the second capping layer CAP2, the third planarization layer OC3, the second light blocking member BK2, the first to third color filters CF1, CF2, and CF3, and the third passivation layer PAS3 which are shown in FIG. 3. Accordingly, the display layer DPL may correspond to all components disposed between the etching stopper WST and the encapsulation layer ENC. Hereinafter, a description of the components described above with reference to FIG. 3 will not be repeated.

The display layer DPL may further include a connection line CWL. The connection line CWL may be exposed at the lower end of the display layer DPL through the third contact hole CNT3, and may be connected to a first pad unit PD1 exposed at the upper end of the etching stopper WST through the through hole BH. The connection line CWL may be connected to a plurality of data lines to supply a data voltage, and may be connected to a plurality of scan lines to supply a scan signal. For example, the connection line CWL may be formed of the same material on the same layer as the source electrode SE or the drain electrode DE of the thin film transistor TFT, but is not limited thereto. For another example, the connection line CWL may be formed of the same material on the same layer as the gate electrode GE of the thin film transistor TFT.

The connection line CWL may be disposed between the plurality of emission areas LA. The connection line CWL may overlap the plurality of light blocking areas BA in the thickness direction. In FIG. 8, the connection line CWL may overlap the second bank BNK2, the first light blocking member BK1 corresponding to the second bank BNK2, and the second light blocking member BK2 corresponding to the first light blocking member BK1 in the thickness direction. Because the connection line CWL is disposed between the plurality of emission areas LA of the display area DA, the display device 10 may not include a separate pad unit disposed at the outermost side, and a bezel area or dead space of the display device 10 can be reduced or minimized. Accordingly, by disposing the connection line CWL in the display area DA and disposing a flexible film 210 on the bottom surface of the display device 10, the gap between the plurality of display devices 10 can be further reduced than when the pad unit is disposed on the outermost side of the display panel or when a flexible film is disposed on the side surface of the display panel.

The mask portion MSK of the insulating layer may be disposed on the lower surface of the substrate 100. For example, the mask portion MSK of the insulating layer may be disposed on the entire surface of the display area DA of the substrate 100. The third portion BHc of the through hole BH may be formed to pass through the mask portion MSK of the insulating layer. The third portion BHc of the through hole BH may be connected to the first portion BHa of the through hole BH formed in the substrate 100 and the second portion BHb of the through hole BH formed in the etching stopper WST.

The mask portion MSK of the insulating layer may include an inorganic insulating material or an organic insulating material. For example, the mask portion MSK of the insulating layer may contain at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. For another example, the mask portion MSK of the insulating layer may include at least one of acrylic resin, epoxy resin, phenolic resin, polyamide resin, or polyimide resin.

The mask portion MSK of the insulating layer may determine the position and size of the through hole BH. The mask portion MSK of the insulating layer may determine the position and size of a modified region in a process of forming a modified region on a part of the substrate 100. For example, a laser may be irradiated to the bottom surface of the substrate 100 through the third portion BHc of the through hole BH formed in the mask portion MSK of the insulating layer. The modified region formed on the substrate 100 may be formed as the first portion BHa of the through hole BH through a wet etching process. Accordingly, the mask portion MSK of the insulating layer may precisely adjust the position of the through hole BH, and reduce or minimize the size of the through hole BH. In some embodiments, the mask portion MSK of the insulating layer may protect a region of the bottom surface of the substrate 100 in which the through hole BH is not formed in the wet etching process of the substrate 100.

The area of the first portion BHa of the through hole BH formed in the substrate 100 may increase from the top surface of the substrate 100 facing the etching stopper WST to the bottom surface of the substrate 100 facing the mask portion MSK. That is, the area of the third portion BHc of the through hole BH formed in the mask portion MSK may be larger than the area of the second portion BHb of the through hole BH formed in the etching stopper WST. The wet etching process of forming the first portion BHa of the through hole BH in the substrate 100 may be performed by exposing the bottom surface of the substrate 100 to the etching solution through the third portion BHc of the through hole BH. For example, when the substrate 100 has a thickness of 0.5 mm, the area of the third portion BHc of the through hole BH formed on the bottom surface of the substrate 100 may be 100 µm or less, and the area of the second portion BHb of the through hole BH formed on the top surface of the substrate 100 may be 50 µm or less. Accordingly, the mask portion MSK of the insulating layer may precisely adjust the position of the through hole BH, and reduce or minimize the size of the through hole BH. In some embodiments, after the mask portion MSK of the insulating layer is used in the process of forming the modified region of the substrate 100, it is also used in the process of forming the first portion BHa of the through hole BH of the substrate 100, thereby reducing process time and cost.

The first pad unit PD1 may be disposed on the bottom surface of the mask portion MSK of the insulating layer. The first pad unit PD1 may be exposed at the upper end of the etching stopper WST through the through hole BH penetrating the mask portion MSK of the insulating layer, the substrate 100, and the etching stopper WST, and may be connected to the connection line CWL exposed at the lower end of the display layer DPL through the third contact hole CNT3. In FIG. 8, the first pad unit PD1 may overlap the connection line CWL, the second bank BNK2 corresponding to the connection line CWL, the first light blocking member BK1 corresponding to the second bank BNK2, and the second light blocking member BK2 corresponding to the first light blocking member BK1 in the thickness direction. The through hole BH through which the first pad unit PD1 passes and the third contact hole CNT3 through which the connection line CWL passes may be connected to each other.

A second pad unit PD2 may be disposed on the bottom surface of the mask portion MSK of the insulating layer, and may be spaced from the first pad unit PD1. The second pad unit PD2 may be connected to the first pad unit PD1 through a lead line LDL. The second pad unit PD2 may receive various voltages or signals from the flexible film 210, and may supply the corresponding voltages or signals to the first pad unit PD1 and the connection line CWL.

A connection film ACF may attach the flexible film 210 to the second pad unit PD2. One surface of the connection film ACF may be attached to the second pad unit PD2, and the other surface of the connection film ACF may be attached to the flexible film 210. For example, the connection film ACF may cover the entire second pad unit PD2, but is not limited thereto.

The connection film ACF may include an anisotropic conductive film. When the connection film ACF includes an anisotropic conductive film, the connection film ACF may have conductivity in a region where the second pad unit PD2 and a contact pad of the flexible film 210 are in contact with each other, and may electrically connect the flexible film 210 to the second pad unit PD2.

The flexible film 210 may be disposed on the bottom surface of the mask portion MSK of the insulating layer. One side of the flexible film 210 may be connected to the second pad unit PD2 (e.g., via the connection film ACF), and the other side of the flexible film 210 may be connected to a source circuit board at the bottom surface of the display device 10. The flexible film 210 may transmit a signal from a source driver 220 to the display device 10. For example, the source driver 220 may be an integrated circuit (IC). In response to a source control signal of a timing controller, the source driver 220 may convert digital video data into an analog data voltage, and may supply it to a data line of the display area DA through the flexible film.

Figure 9:
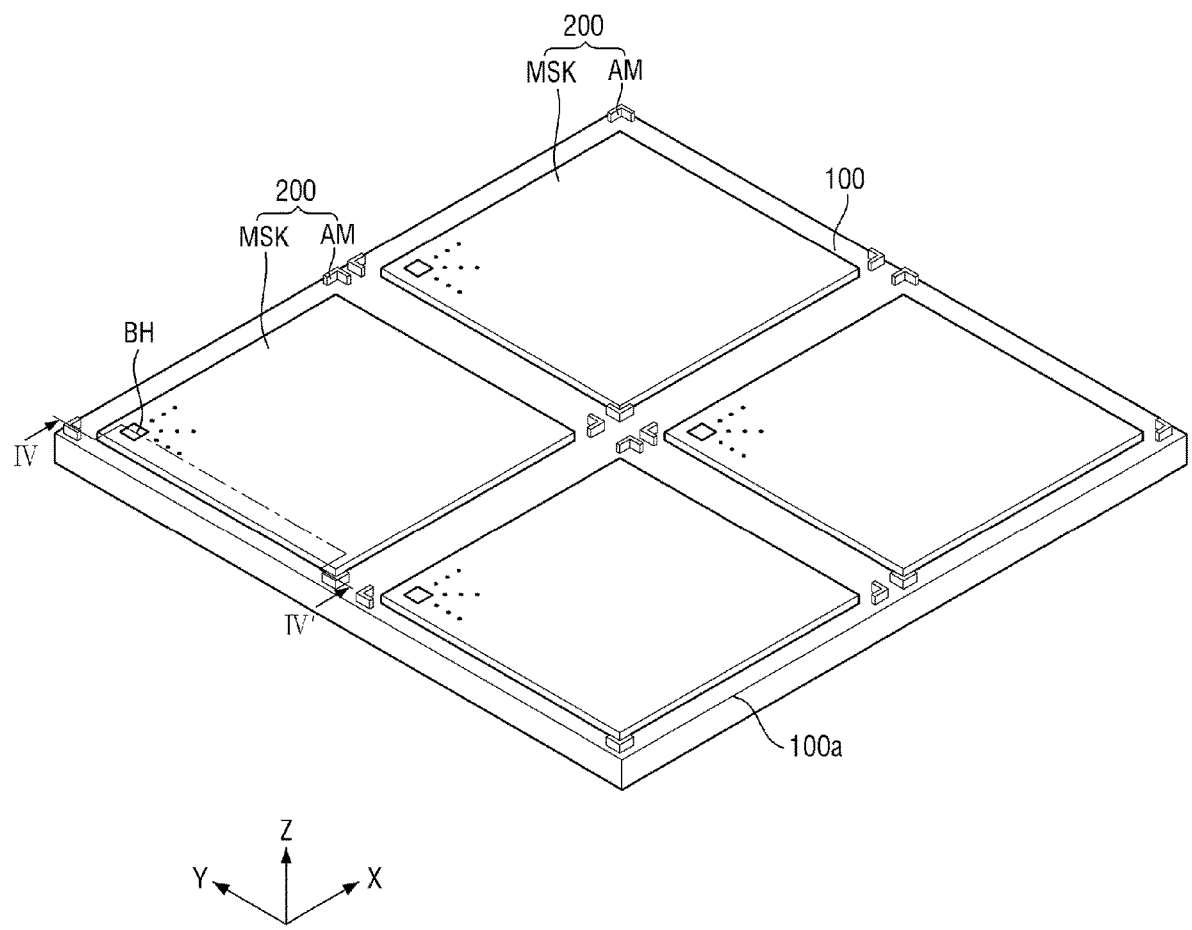
FIG. 9 is a perspective view illustrating a first step in a manufacturing process of a display device according to an embodiment.
Figure 10:
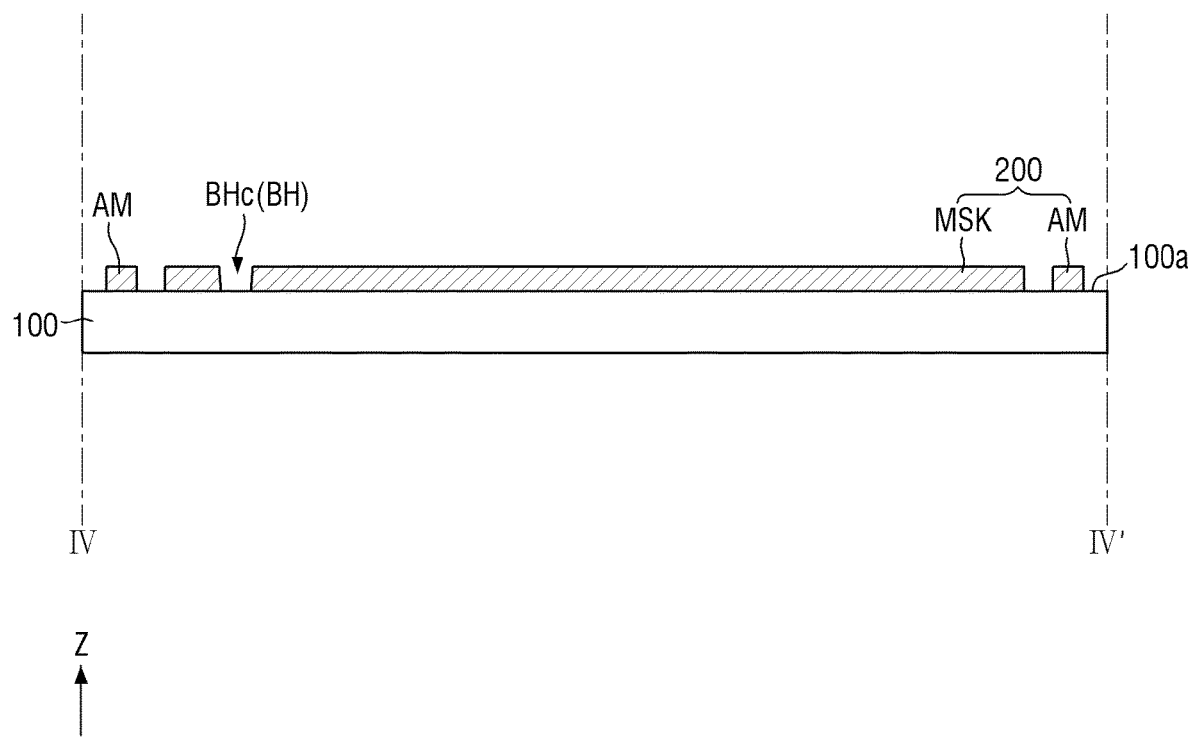
FIG. 10 is a cross-sectional view taken along the line IV-IV' of FIG. 9.

FIG. 9 is a perspective view illustrating a first step in a manufacturing process of a display device according to an embodiment. FIG. 10 is a cross-sectional view taken along the line IV-IV' of FIG. 9.

Referring to FIGS. 9 and 10, in the manufacturing process of the display device 10, one substrate 100 may serve as a mother substrate that can become the substrate 100 of each of the plurality of display devices 10. For example, after the display layer DPL of each of the plurality of display devices 10 is formed, one substrate 100 serving as a mother substrate is cut to be used as the substrate 100 of each of the plurality of display devices 10.

An insulating layer 200 may be disposed on one surface 100a of the substrate 100. A material of the insulating layer 200 may be applied to one surface of the substrate 100 and then patterned. The material of the insulating layer 200 may be disposed on the one surface 100a of the substrate 100, and may be patterned using a photoresist process. For example, the material of the insulating layer 200 may be a negative photoresist. The material of the insulating layer 200 may be widely provided on the one surface 100a of the substrate 100, and a mask portion may be disposed except for regions where the mask portion MSK and an alignment mark portion AM are to be provided. When light is irradiated toward the mask portion and the insulating layer 200, regions other than the mask portion MSK and the alignment mark portion AM are dissolved, thereby providing the mask portion MSK and the alignment mark portion AM.

For example, the material of the insulating layer 200 may be a positive photoresist. The mask portion may be disposed in regions where the mask portion MSK and the alignment mark portion AM are to be provided. When light is irradiated toward the mask portion and the insulating layer 200, regions other than the mask portion MSK and the alignment mark portion AM are dissolved, thereby providing the mask portion MSK and the alignment mark portion AM.

The insulating layer 200 may include an inorganic insulating material or an organic insulating material. For example, the insulating layer 200 may contain at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. For another example, the insulating layer 200 may include at least one of acrylic resin, epoxy resin, phenolic resin, polyamide resin, or polyimide resin. The patterned insulating layer 200 may include the mask portion MSK and the alignment mark portion AM, and the third portion BHc of the through hole BH may be formed in a partial region of the mask portion MSK.

The mask portion MSK may overlap the display area DA of the substrate 100 and may surround the third portion BHc of at least one through hole BH. For example, the mask portion MSK may be disposed on the entire surface of the display area DA of the substrate 100. The mask portion MSK of the insulating layer may determine the position and size of the through hole BH. The mask portion MSK may determine the position and size of a modified region in a process of forming a modified region on a part of the substrate 100. For example, a laser may be irradiated to the one surface 100a of the substrate 100 through the third portion BHc of the through hole BH formed in the mask portion MSK. The modified region formed on the substrate 100 may be formed as the first portion BHa of the through hole BH through a wet etching process. Accordingly, the mask portion MSK may precisely adjust the position of the through hole BH, and reduce or minimize the size of the through hole BH. In some embodiments, the mask portion MSK may protect a region of the bottom surface of the substrate 100 in which the through hole BH is not formed in the wet etching process of the substrate 100.

The alignment mark portion AM may overlap the non-display area NDA of the substrate 100. The alignment mark portion AM may be spaced from the mask portion MSK, and may be disposed adjacent to each of a plurality of corners of the mask portion MSK. The alignment mark portion AM may improve process precision in a process of forming the display layer DPL of the display device 10. For example, the alignment mark portion AM may be used in a process of forming the thin film transistor layer TFTL of the display layer DPL, the light emitting element layer EML, the first light blocking member BK1, the first wavelength conversion unit WLC1, the second wavelength conversion unit WLC2, the light transmission unit LTU, the second light blocking member BK2, and the first to third color filters CF1, CF2, and CF3. Therefore, the display device 10 includes the alignment mark portion AM made of the same material on the same layer as the mask portion MSK, thereby improving the process precision of the display layer DPL without using a separate alignment mark.

The shape of the alignment mark portion AM is not limited to the shape shown in FIG. 9. The shape of the alignment mark portion AM may be changed according to design conditions and needs so as to maintain an alignment function.

Figure 11:
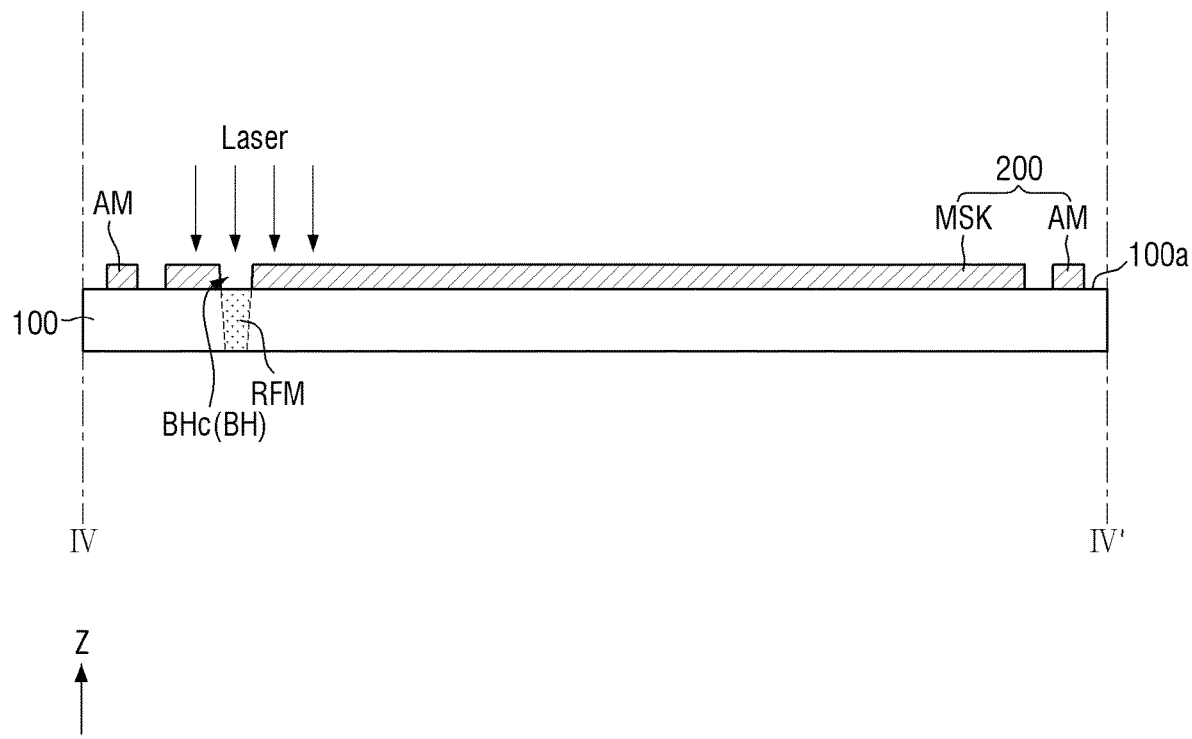
FIG. 11 is a perspective view illustrating a second step in a manufacturing process of a display device according to an embodiment.

FIG. 11 is a perspective view illustrating a second step in a manufacturing process of a display device according to an embodiment.

Referring to FIG. 11, the mask portion MSK may determine the position and size of a modified region RFM in a process of forming the modified region RFM on a part of the substrate 100. A laser may be irradiated to the one surface 100a of the substrate 100 through the third portion BHc of the through hole BH formed in the mask portion MSK, and a portion of the substrate 100 exposed to the laser may be modified into the modified region RFM. For example, when the substrate 100 includes a glass material, the modified region RFM may be formed by breaking Si—bonds of the glass of the substrate 100. The modified region RFM is removed through a wet etching process, so that the first portion BHa of the through hole BH may be formed.

Figure 12:
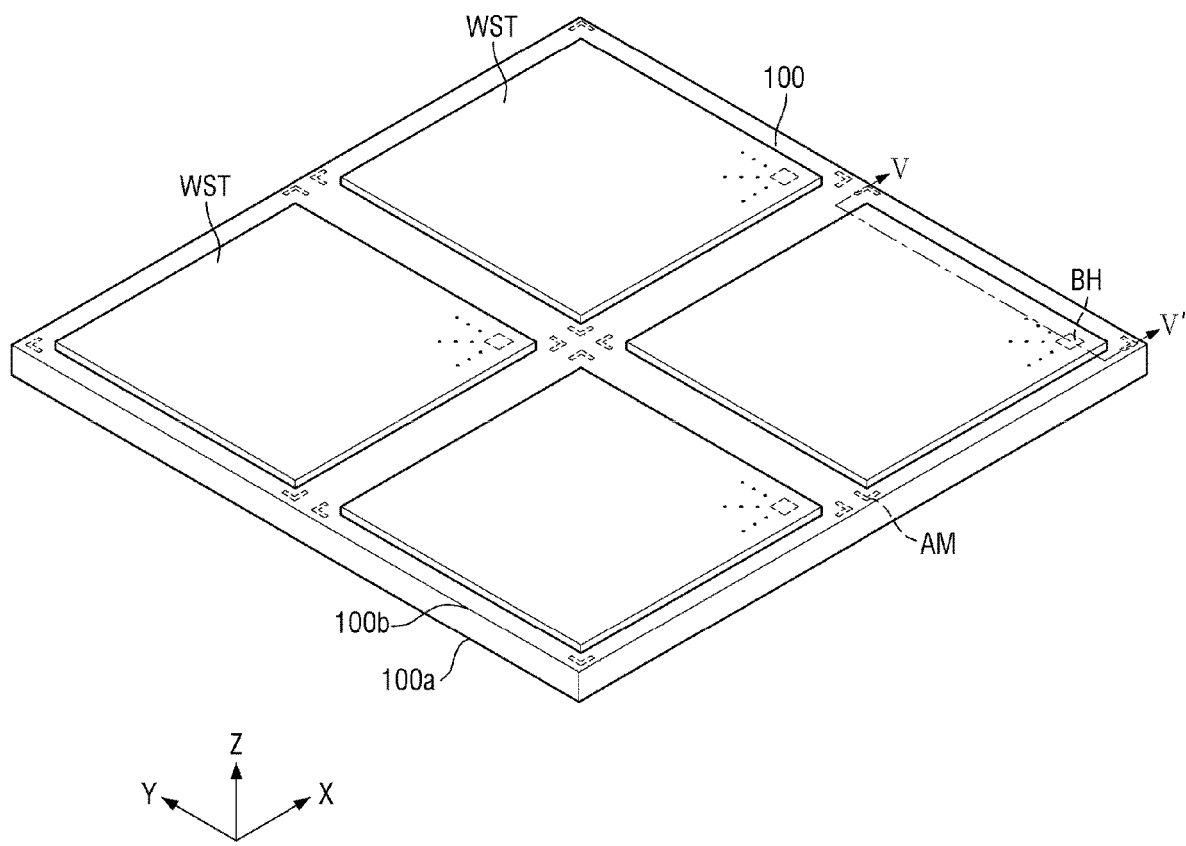
FIG. 12 is a perspective view illustrating a third step in a manufacturing process of a display device according to an embodiment.
Figure 13:
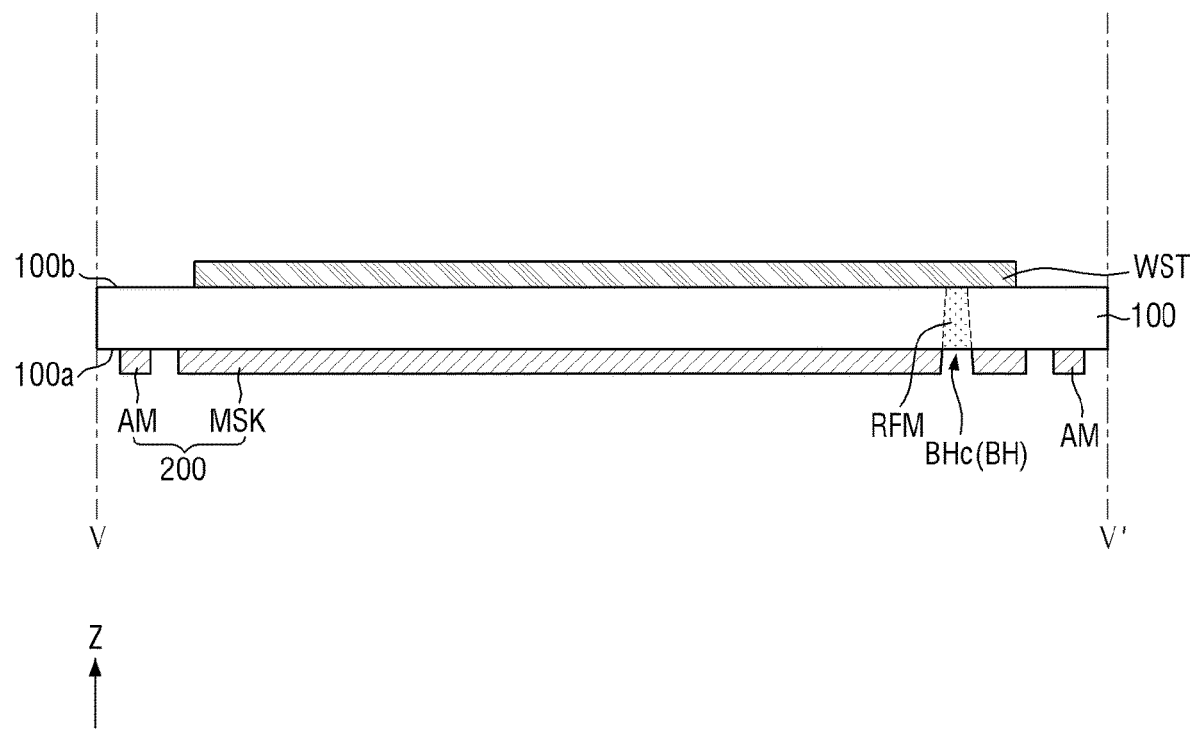
FIG. 13 is a cross-sectional view taken along the line V-V' of FIG. 12.

FIG. 12 is a perspective view illustrating a third step in a manufacturing process of a display device according to an embodiment. FIG. 13 is a cross-sectional view taken along the line V-V' of FIG. 12.

Referring to FIGS. 12 and 13, the etching stopper WST may be disposed on the other surface 100b of the substrate 100. The etching stopper WST may be disposed to overlap the display area DA on the other surface 100b of the substrate 100. For example, the etching stopper WST may be integrally formed to overlap the third portions BHc of the plurality of through holes BH provided in the mask portion MSK. The etching stopper WST may be integrally formed to cover one surface of each of a plurality of modified regions RFM provided on the substrate 100.

The etching stopper WST may include an inorganic insulating material or an organic insulating material. For example, the etching stopper WST may contain at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. For example, the etching stopper WST may include at least one of acrylic resin, epoxy resin, phenolic resin, polyamide resin, or polyimide resin. The etching stopper WST may prevent or substantially prevent diffusion of an etching solution to the display layer DPL in a process of forming the first portion BHa of the through hole BH penetrating the substrate 100.

Figure 14:
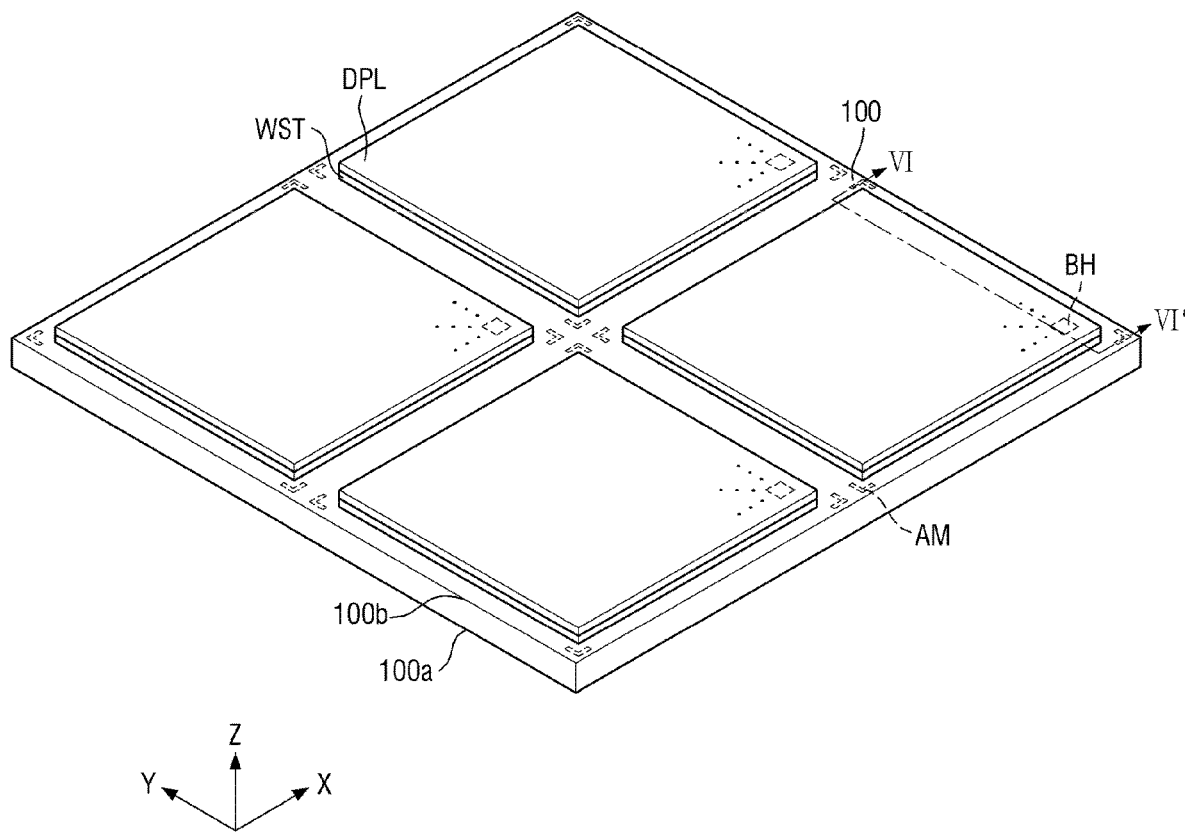
FIG. 14 is a perspective view illustrating a fourth step in a manufacturing process of a display device according to an embodiment.
Figure 15:
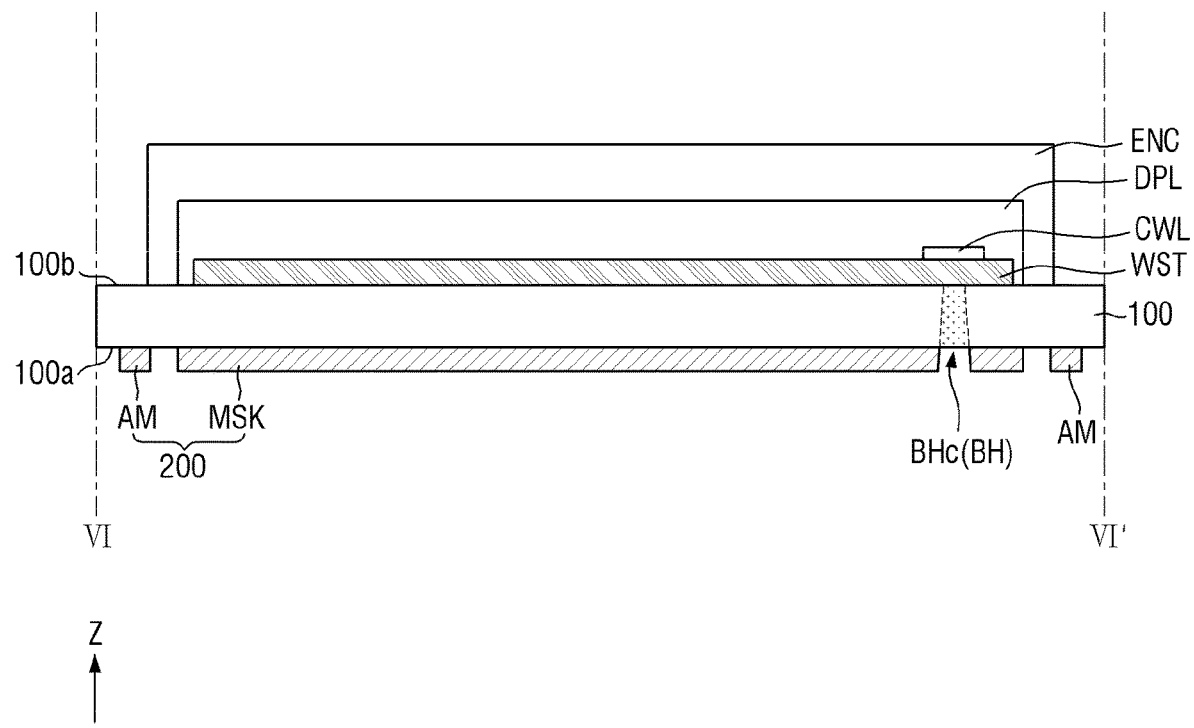
FIG. 15 is a cross-sectional view taken along the line VI-VI' of FIG. 14.

FIG. 14 is a perspective view illustrating a fourth step in a manufacturing process of a display device according to an embodiment. FIG. 15 is a cross-sectional view taken along the line VI-VI' of FIG. 14.

Referring to FIGS. 14 and 15, the display layer DPL may be disposed on the etching stopper WST, and the encapsulation layer ENC may cover the side surface of the display layer DPL and the top surface of the substrate 100. The display layer DPL may include the buffer layer BF, the thin film transistor layer TFTL, the light emitting element layer EML, the second planarization layer OC2, the first capping layer CAP1, and the first light blocking member BK1, the first wavelength conversion unit WLC1, the second wavelength conversion unit WLC2, the light transmission unit LTU, the second capping layer CAP2, the third planarization layer OC3, the second light blocking member BK2, the first to third color filters CF1, CF2, and CF3, and the third passivation layer PAS3 which are shown in FIG. 3.

Figure 16:
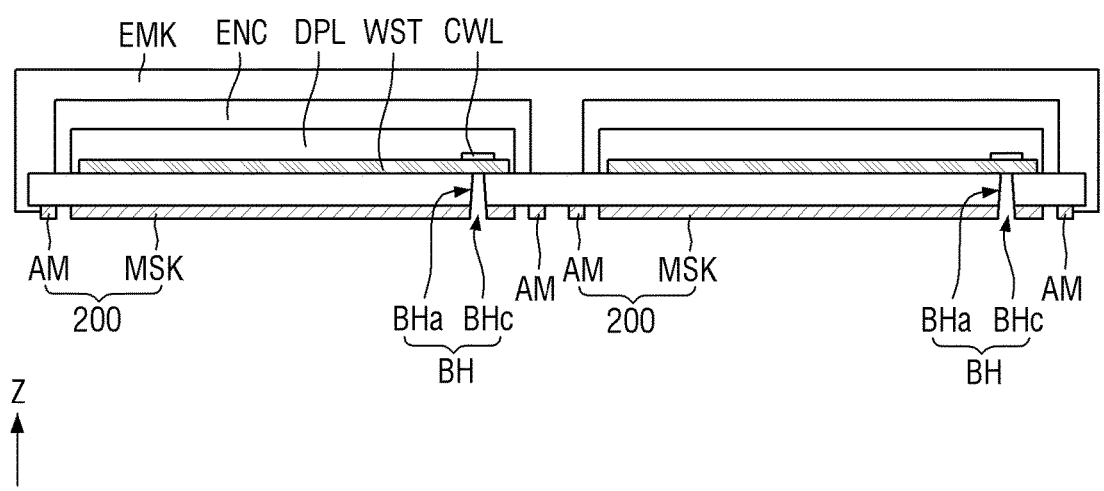
FIG. 16 is a cross-sectional view illustrating a fifth step in a manufacturing process of a display device according to an embodiment.

FIG. 16 is a cross-sectional view illustrating a fifth step in a manufacturing process of a display device according to an embodiment.

Referring to FIG. 16, an etching mask EMK may cover the top and side surfaces of the plurality of display devices 10. The etching mask EMK may cover all surfaces of the substrate 100 on which the insulating layer 200 is not formed. The etching mask EMK may cover surfaces other than the one surface 100a of the substrate 100 on which the insulating layer 200 is formed. The etching mask EMK may include a material that does not react to a wet etching solution. Accordingly, the etching mask EMK covers other surfaces except for the one surface 100a of the substrate 100, and the mask portion MSK of the insulating layer 200 covers a region of the one surface 100a of the substrate 100 in which the through hole BH is not formed, thereby protecting a region of the bottom surface of the substrate 100 in which the through hole BH is not formed in the wet etching process of the substrate 100. The mask portion MSK of the insulating layer 200 may reduce or minimize the area of the first portion BHa of the through hole BH formed in the substrate 100.

The modified region RFM may be formed by changing a chemical structure of a material forming the substrate 100. The modified region RFM may be removed by reacting with an etching solution in the wet etching process, and the first portion BHa of the through hole BH may be formed. For example, as the etching solution used in the wet etching process, a basic solution such as potassium hydroxide (KOH) or sodium hydroxide (NaOH) may be used, or an acidic solution such as hydrofluoric acid (HF) may be used.

Figure 17:
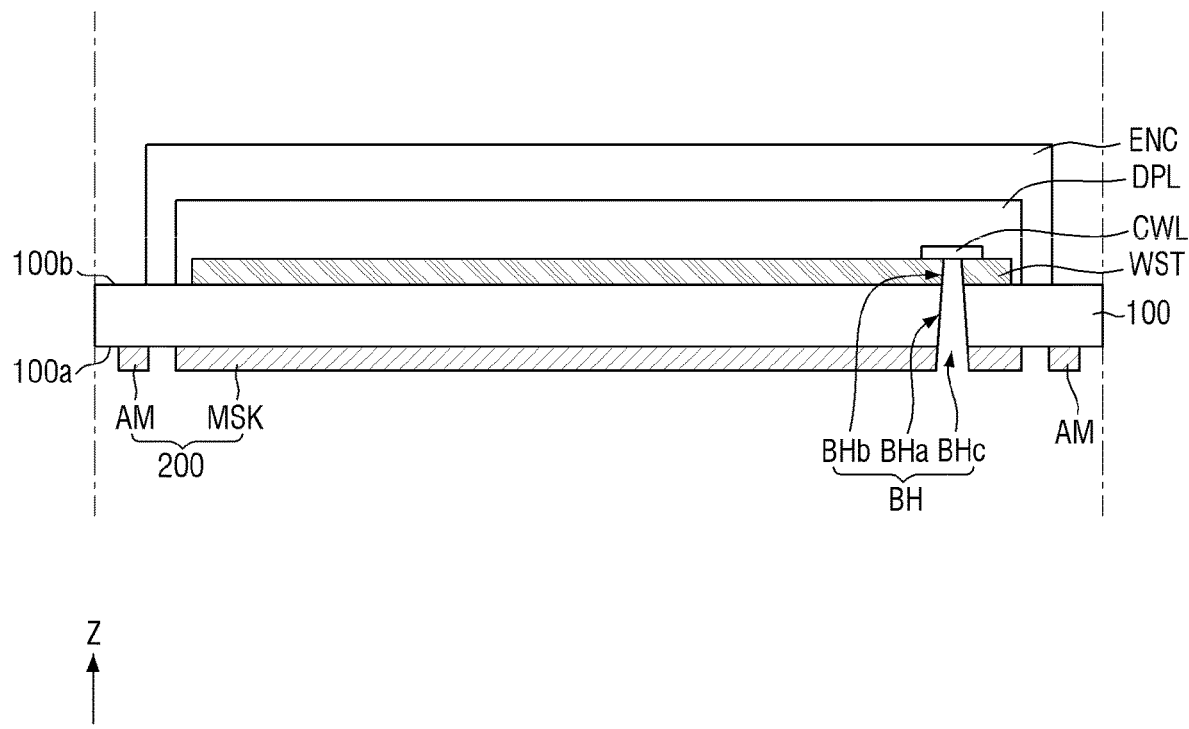
FIG. 17 is a cross-sectional view illustrating a sixth step in a manufacturing process of a display device according to an embodiment.

FIG. 17 is a cross-sectional view illustrating a sixth step in a manufacturing process of a display device according to an embodiment.

Referring to FIG. 17, when the first portion BHa of the through hole BH is formed, the bottom surface of the etching stopper WST corresponding to the through hole BH may be exposed. A partial region of the etching stopper WST corresponding to the through hole BH may be formed as the second portion BHb of the through hole BH through a dry etching process. When the second portion BHb of the through hole BH penetrating the etching stopper WST is formed, the connection line CWL may be exposed at the lower end of the display layer DPL.

Figure 18:
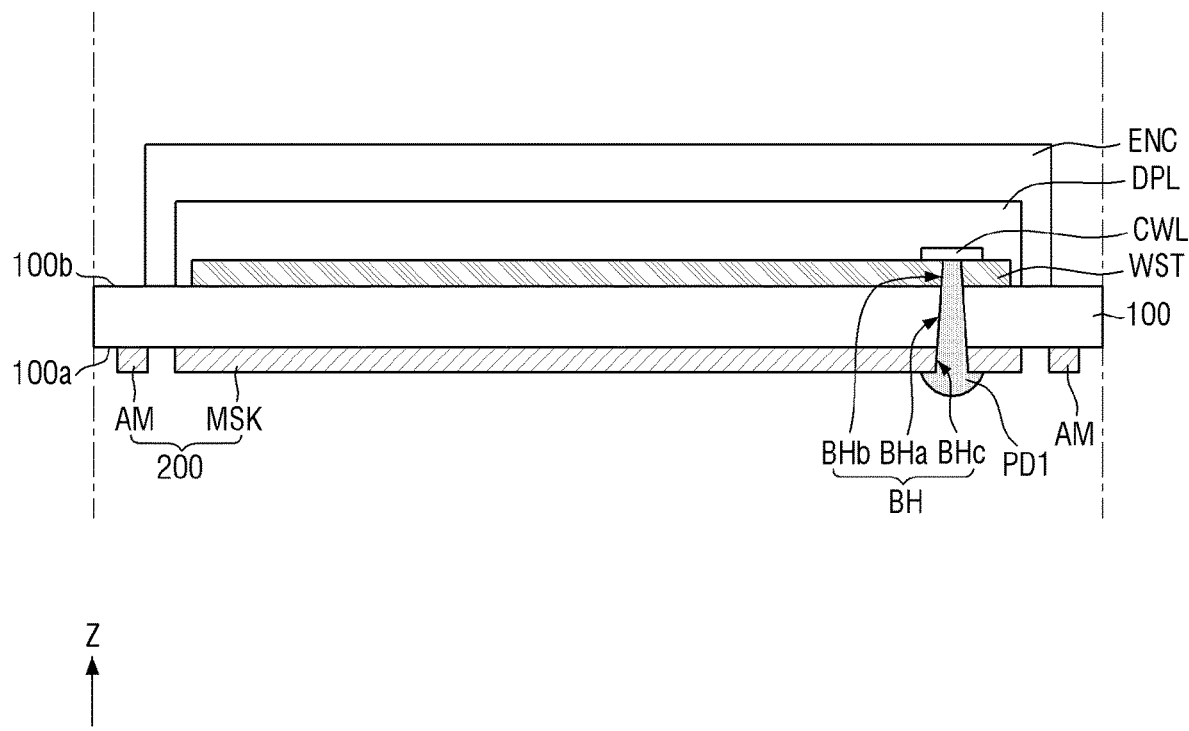
FIG. 18 is a cross-sectional view illustrating a seventh step in a manufacturing process of a display device according to an embodiment.

FIG. 18 is a cross-sectional view illustrating a seventh step in a manufacturing process of a display device according to an embodiment.

Referring to FIG. 18, a material forming the first pad unit PD1 may fill the through hole BH and may protrude from the bottom surface of the insulating layer 200. For example, the first pad unit PD1 include at least one of molybdenum (Mo), aluminum (Al), chromium (Cr), gold (Au), titanium (Ti), nickel (Ni), neodymium (Nd), or copper (Cu).

Figure 19:
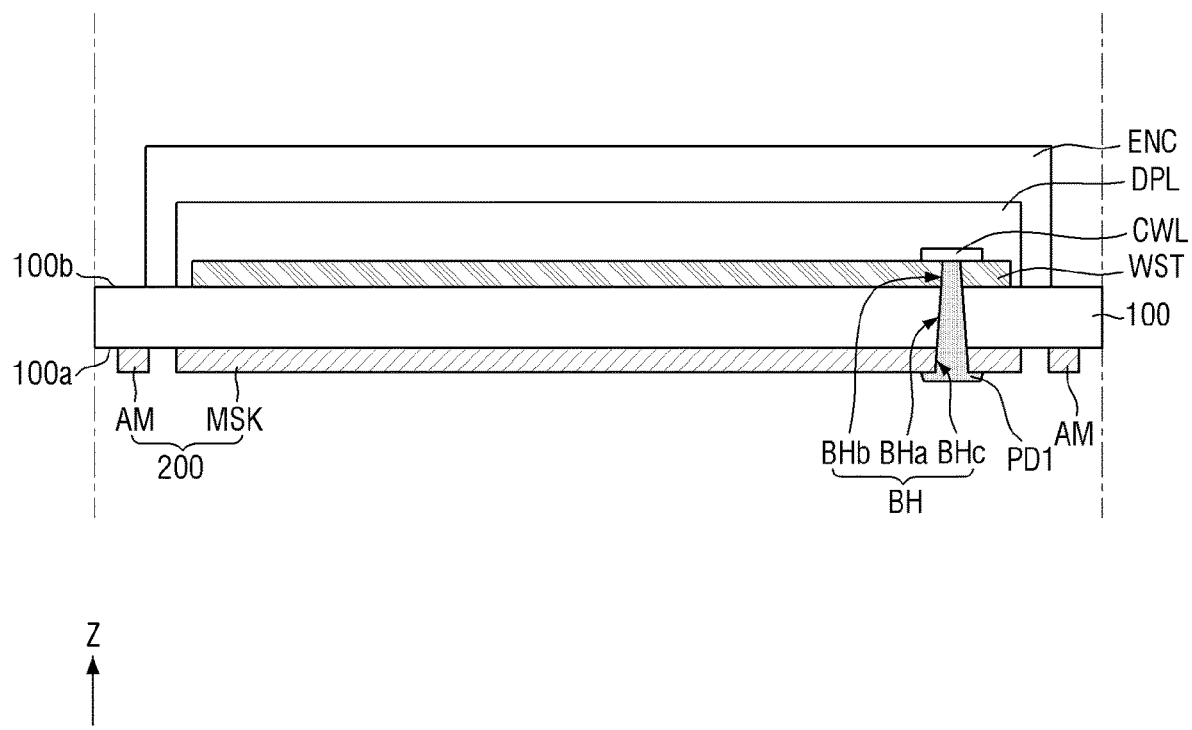
FIG. 19 is a cross-sectional view illustrating an eighth step in a manufacturing process of a display device according to an embodiment.

FIG. 19 is a cross-sectional view illustrating an eighth step in a manufacturing process of a display device according to an embodiment.

Referring to FIG. 19, the bottom surface of the first pad unit PD1 protruding from the bottom surface of the insulating layer 200 may be planarized through a chemical mechanical polishing (CMP) process. The mask portion MSK of the insulating layer 200 may prevent damage to the bottom surface of the substrate 100 in the chemical mechanical polishing process of the first pad unit PD1.

Figure 20:
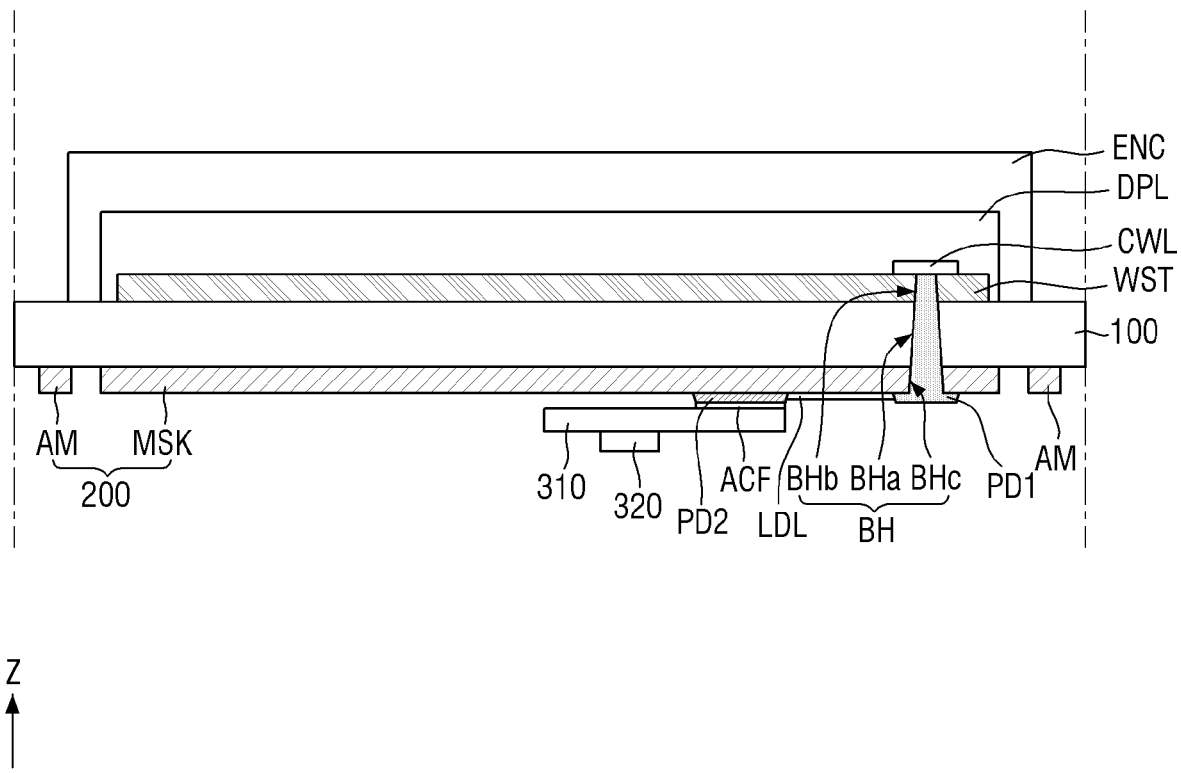
FIG. 20 is a cross-sectional view illustrating a ninth step in a manufacturing process of a display device according to an embodiment.
Figure 21:
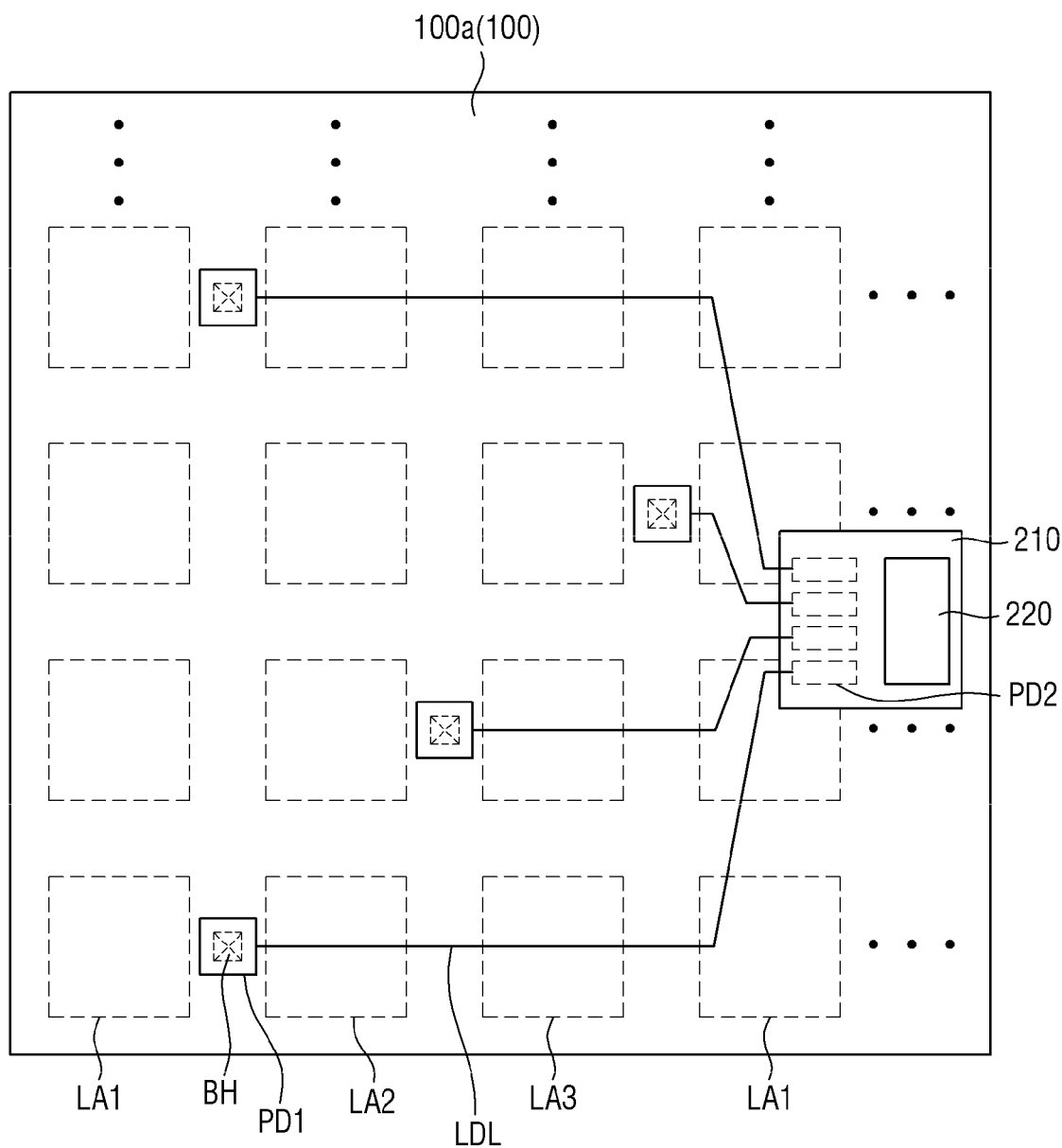
FIG. 21 is a rear view illustrating a display device according to an embodiment.

FIG. 20 is a cross-sectional view illustrating a ninth step in a manufacturing process of a display device according to an embodiment. FIG. 21 is a rear view illustrating a display device according to an embodiment.

Referring to FIGS. 20 and 21, the first pad unit PD1 may be disposed on the bottom surface of the mask portion MSK of the insulating layer. The first pad unit PD1 may be exposed at the upper end of the etching stopper WST through the through hole BH, and may be connected to the connection line CWL exposed at the lower end of the display layer DPL through the third contact hole CNT3. The through hole BH through which the first pad unit PD1 passes and the third contact hole CNT3 through which the connection line CWL passes may be connected to each other.

A second pad unit PD2 may be disposed on the bottom surface of the mask portion MSK of the insulating layer, and may be spaced from the first pad unit PD1. The second pad unit PD2 may be connected to the first pad unit PD1 through a lead line LDL. The second pad unit PD2 may receive various voltages or signals from the flexible film 210, and may supply the corresponding voltages or signals to the first pad unit PD1 and the connection line CWL.

A connection film ACF may attach the flexible film 210 to the second pad unit PD2. One surface of the connection film ACF may be attached to the second pad unit PD2, and the other surface of the connection film ACF may be attached to the flexible film 210. For example, the connection film ACF may cover the entire second pad unit PD2, but is not limited thereto.

The flexible film 210 may be disposed on the bottom surface of the mask portion MSK of the insulating layer. One side of the flexible film 210 may be connected to the second pad unit PD2, and the other side of the flexible film 210 may be connected to a source circuit board at the bottom surface of the display device 10. The flexible film 210 may transmit a signal from the source driver 220 to the display device 10. For example, the source driver 220 may be an integrated circuit (IC). In response to a source control signal of a timing controller, the source driver 220 may convert digital video data into an analog data voltage, and may supply it to a data line of the display area DA through the flexible film.

Figure 22:
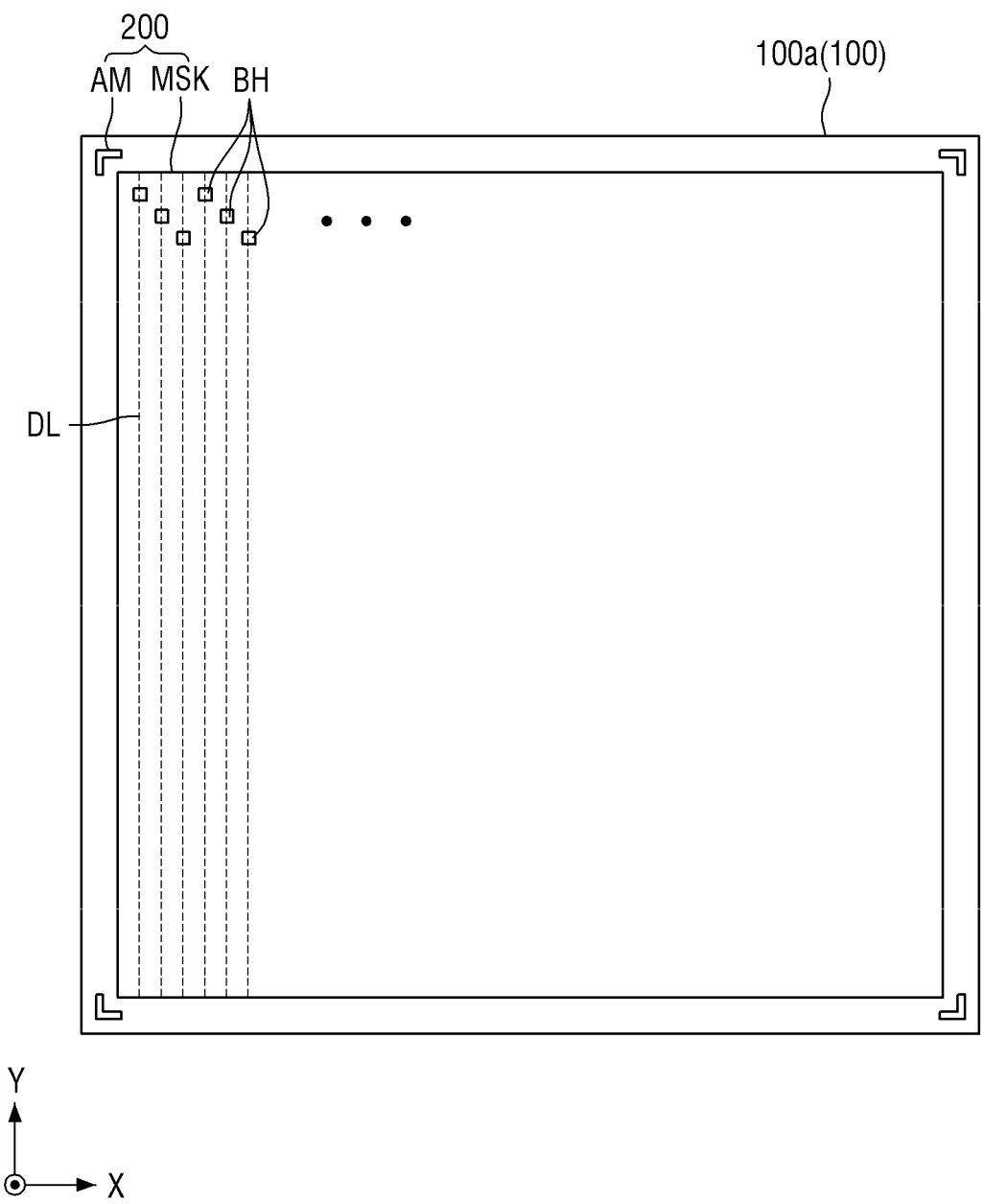
FIG. 22 is a plan view illustrating an insulating layer and a through hole of a display device according to an embodiment.

FIG. 22 is a plan view illustrating an insulating layer and a through hole of a display device according to an embodiment.

Referring to FIG. 22, the display area DA may include a plurality of pixels SP and at least one line connected to each of the plurality of pixels SP. At least one line may be a data line DL or a scan line (not shown). The data line DL or the scan line may correspond to one through hole BH, and may be connected to a connection line CWL corresponding to the through hole BH. The connection line CWL may be connected to a plurality of data lines DL to supply a data voltage, and may be connected to a plurality of scan lines to supply a scan signal. Accordingly, the first pad unit PD1 may be connected to the connection line CWL through the through hole BH, and various voltages or signals received from the flexible film 210 may be supplied to the connection line CWL.

The through holes BH corresponding to the data lines DL adjacent to each other from among the plurality of data lines DL may be alternately disposed. The plurality of data lines DL may extend in the second direction (Y-axis direction) and may be spaced from each other in the first direction (X-axis direction). In this case, the through holes BH corresponding to the data lines DL adjacent in the first direction (X-axis direction) may be spaced in a diagonal direction between the first direction (X-axis direction) and the second direction (Y-axis direction). Accordingly, even if the display device 10 includes a plurality of through holes BH, the rigidity of the substrate 100 may be maintained.

Figure 23:
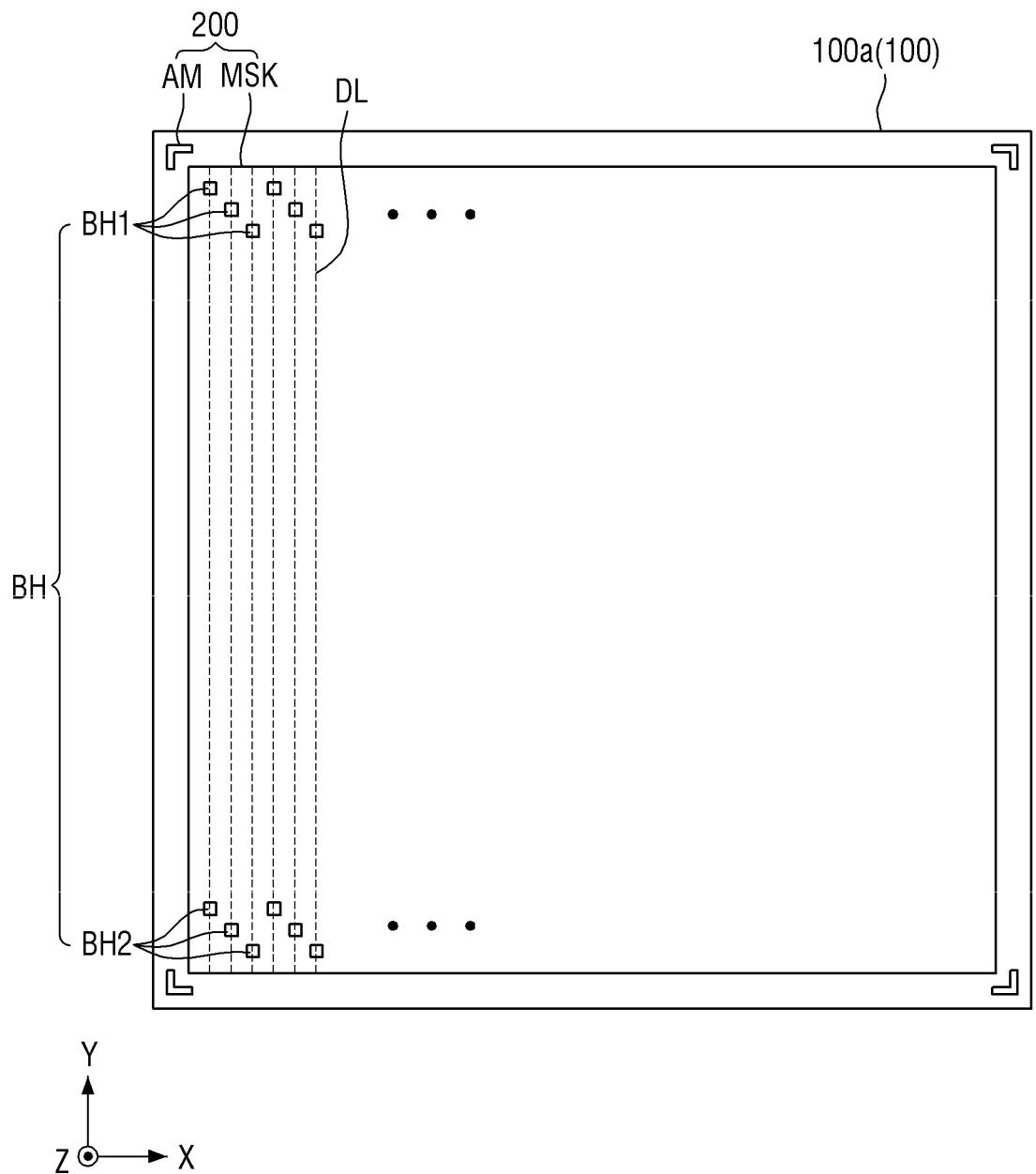
FIG. 23 is a plan view illustrating an insulating layer and a through hole of a display device according to an embodiment.

FIG. 23 is a plan view illustrating an insulating layer and a through hole of a display device according to another embodiment.

Referring to FIG. 23, the display area DA may include a plurality of pixels SP and at least one line connected to each of the plurality of pixels SP. At least one line may be a data line DL or a scan line (not shown). One data line DL or scan line may correspond to first and second through holes BH1 and BH2, and may be connected to a connection line CWL corresponding to each of the first and second through holes BH1 and BH2. The connection line CWL may be connected to a plurality of data lines DL to supply a data voltage, and may be connected to a plurality of scan lines to supply a scan signal. Accordingly, two first pad units PD1 may be respectively connected to both sides of the data line DL, and the display device 10 may stably supply various voltages or signals to both sides of the data line DL.

For example, one data line DL or scan line may correspond to three or more through holes BH, and may be connected to a connection line CWL corresponding to each of the plurality of through holes BH.

Figure 24:
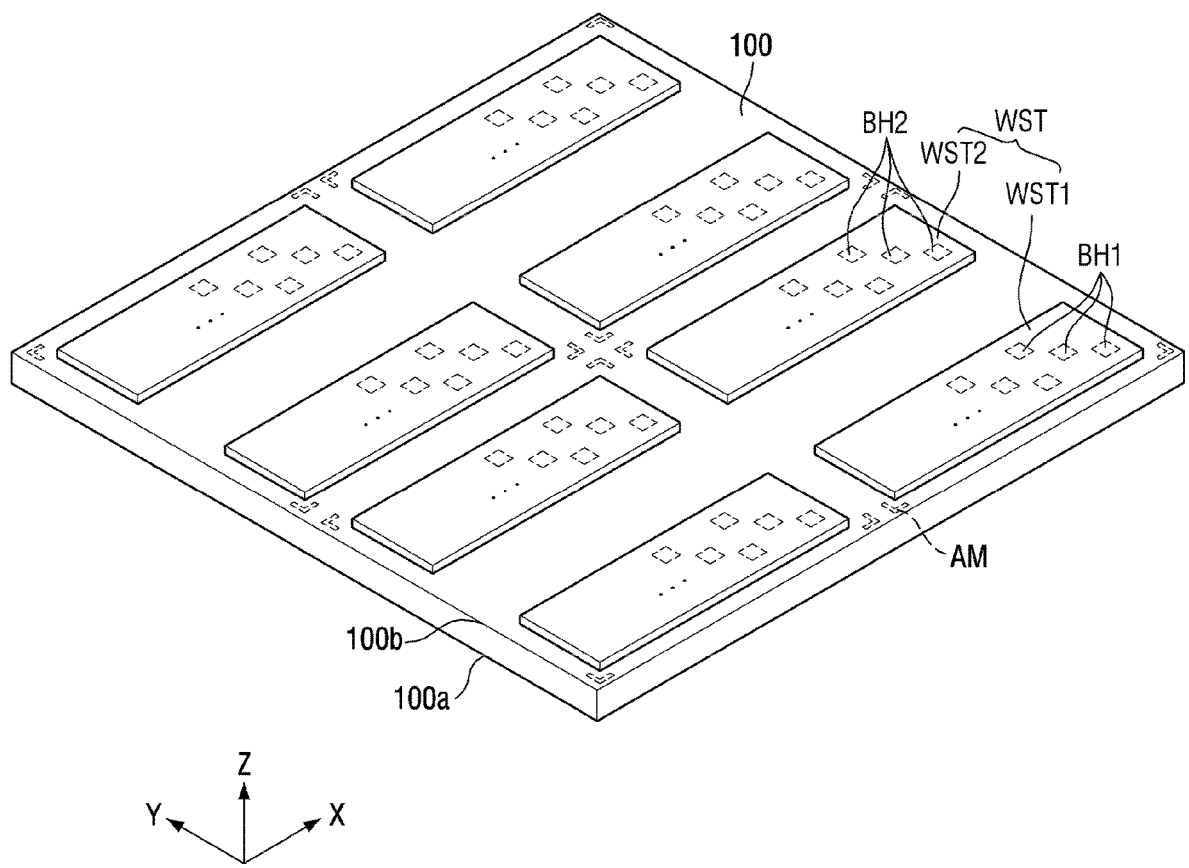
FIG. 24 is a perspective view illustrating an etching stopper and a through hole of a display device according to an embodiment.

FIG. 24 is a perspective view illustrating an etching stopper and a through hole of a display device according to still another embodiment.

Referring to FIG. 24, the display area DA may include a plurality of pixels SP and at least one line connected to each of the plurality of pixels SP. At least one line may be a data line DL or a scan line (not shown). One data line DL or scan line may correspond to first and second through holes BH1 and BH2, and may be connected to a connection line CWL corresponding to each of the first and second through holes BH1 and BH2.

The etching stopper WST may overlap a part of the display area DA. The etching stopper WST may include first and second etching stoppers WST1 and WST2. The first etching stopper WST1 may correspond to the first through hole BH1 from among the plurality of through holes BH, and the second etching stopper WST2 may correspond to the second through hole BH2 from among the plurality of through holes BH. The first and second etching stoppers WST1 and WST2 may cover the other surface 100b of the substrate 100 corresponding to the first and second through holes BH1 and BH2, respectively.

Figure 25:
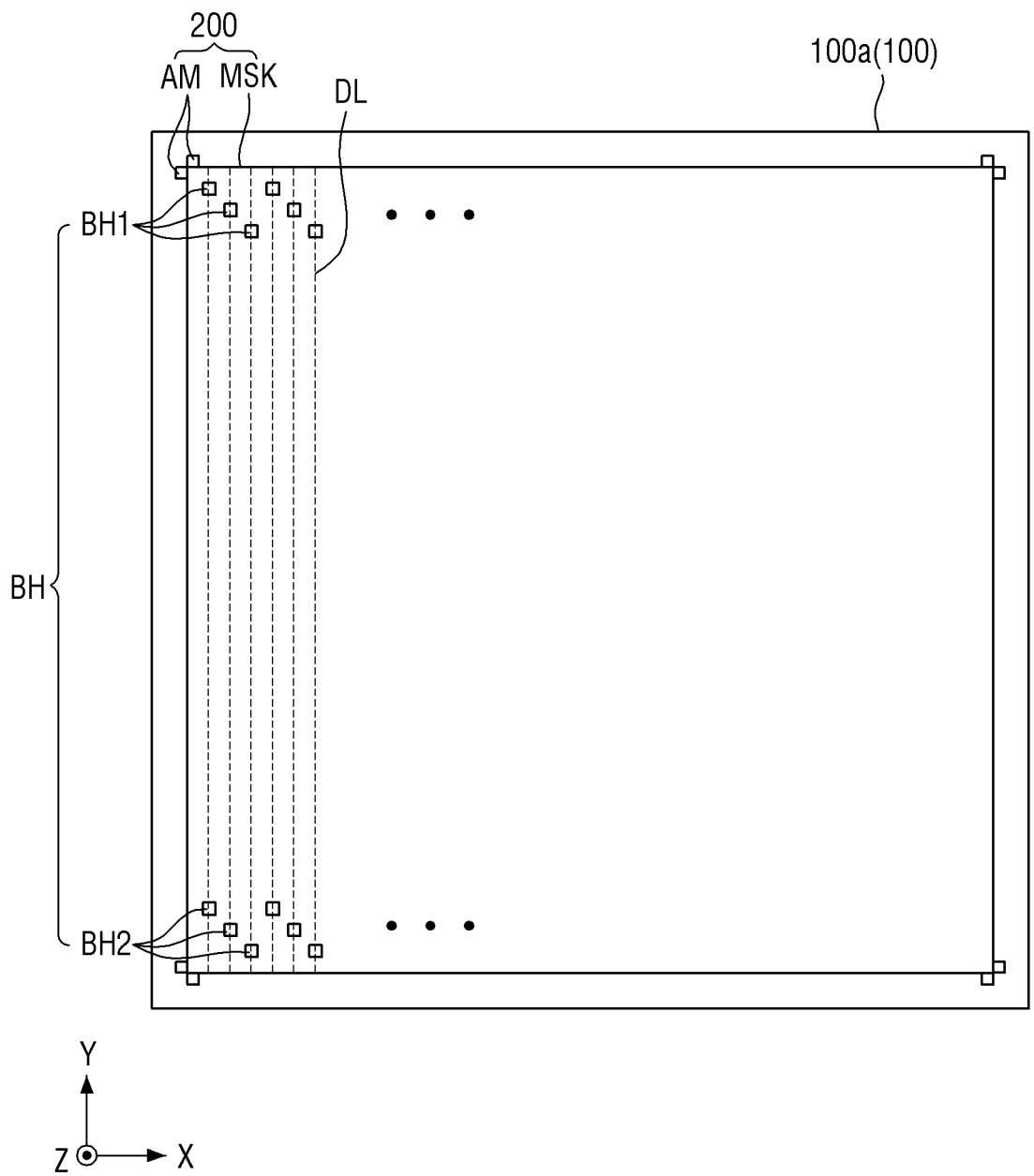
FIG. 25 is a plan view illustrating an insulating layer and a through hole of a display device according to an embodiment.

FIG. 25 is a plan view illustrating an insulating layer and a through hole of a display device according to still another embodiment.

Referring to FIG. 25, the insulating layer 200 may include a mask portion MSK and an alignment mark portion AM. The mask portion MSK may overlap the display area DA, and the alignment mark portion AM may overlap the non-display area NDA.

The mask portion MSK and the alignment mark portion AM may be integrally formed. The alignment mark portion AM may protrude from the mask portion MSK. For example, the alignment mark portion AM may protrude from each of a plurality of corners of the mask portion MSK. The display device 10 includes the alignment mark portion AM made of the same material on the same layer as the mask portion MSK, thereby improving the process precision of the display layer DPL without using a separate alignment mark. In some embodiments, the tiled display device TD reduces the area of the non-display area NDA where the alignment mark portion AM is formed, so that the boundary portions or the non-display areas NDA between the plurality of display devices 10 may be prevented or substantially prevented from being recognized, thereby removing or reducing a sense of disconnection between the plurality of display devices 10 and improving a sense of immersion in an image.

What is claimed is:

1. A display device comprising:
   a substrate comprising a display area and a non-display area, the substrate having a first portion of a through hole penetrating in a thickness direction thereof in the display area;
   an etching stopper on one surface of the substrate, a second portion of the through hole penetrating the etching stopper in the thickness direction and connected to one end of the first portion of the through hole;
   a display layer on one surface of the etching stopper, the display layer comprising a connection line on the second portion of the through hole;
   an insulating layer on other surface opposite to the one surface of the substrate, the insulating layer having a third portion of the through hole connected to an other end opposite to the one end of the first portion of the through hole; and
   a pad unit on an other surface of the insulating layer and connected to the connection line through the through hole.

2. The display device of claim 1, wherein the insulating layer comprises:
   a mask portion overlapping the display area of the substrate and surrounding the third portion of the through hole; and
   a plurality of alignment mark portions overlapping the non-display area of the substrate.

3. The display device of claim 2, wherein the plurality of alignment mark portions are spaced from the mask portion, and each of the plurality of alignment mark portions is adjacent to each of a plurality of corners of the mask portion.

4. The display device of claim 2, wherein each of the plurality of alignment mark portions protrudes from a corresponding one of a plurality of corners of the mask portion.

5. The display device of claim 1, further comprising:
   a flexible film on the other surface of the insulating layer and connected to the pad unit; and
   a source driver on the flexible film.

6. The display device of claim 1, wherein the display area comprises a plurality of pixels and at least one line connected to each of the plurality of pixels, and
   the connection line is connected to the at least one line.

7. The display device of claim 1, wherein the display layer comprises a plurality of data lines and a plurality of connection lines, and
   each of the plurality of data lines is connected to a corresponding one of the plurality of connection lines corresponding to a corresponding one of a plurality of through holes.

8. The display device of claim 7, wherein the plurality of through holes corresponding to adjacent data lines from among the plurality of data lines are spaced from each other along a direction perpendicular to the data line.

9. The display device of claim 7, wherein the etching stopper comprises:
   a first etching stopper corresponding to a part of the plurality of through holes; and
   a second etching stopper spaced from the first etching stopper and corresponding to another part of the plurality of through holes.

10. The display device of claim 7, wherein the etching stopper is integrally formed to overlap the display area.

11. The display device of claim 1, wherein the display layer comprises:
- a buffer layer on the etching stopper;
- a thin film transistor layer on the buffer layer; and
- a light emitting element layer on the thin film transistor layer and comprising a plurality of light emitting members corresponding to a plurality of emission areas of the display area.

12. The display device of claim 11, wherein the display layer further comprises:
- a first planarization layer configured to planarize a top surface of the light emitting element layer;
- a wavelength conversion unit on the first planarization layer and corresponding to one of the plurality of emission areas;
- a light transmission unit on the first planarization layer and corresponding to another one of the plurality of emission areas;
- a second planarization layer configured to planarize top surfaces of the wavelength conversion unit and the light transmission unit; and
- a plurality of color filters on the second planarization layer and corresponding to the plurality of emission areas.

13. A tiled display device comprising:
- a plurality of display devices, each of the plurality of display devices comprising a display area comprising a plurality of pixels and a non-display area surrounding the display area; and
- a coupling member configured to couple the plurality of display devices,
- wherein each of the plurality of display devices comprises:
  - a substrate having a first portion of a through hole penetrating in a thickness direction thereof in the display area;
  - an etching stopper on one surface of the substrate, a second portion of the through hole penetrating the etching stopper in the thickness direction and connected to one end of the first portion of the through hole;
  - a display layer on one surface of the etching stopper, the display layer comprising a connection line on the second portion of the through hole;
  - an insulating layer on other surface opposite to the one surface of the substrate, the insulating layer having a third portion of the through hole connected to an other end opposite to the one end of the first portion of the through hole; and
  - a pad unit on an other surface of the insulating layer and connected to the connection line through the through hole.

14. The tiled display device of claim 13, wherein the insulating layer comprises:
- a mask portion overlapping the display area of the substrate and surrounding the third portion of the through hole; and
- a plurality of alignment mark portions overlapping the non-display area of the substrate.

15. The tiled display device of claim 14, wherein the plurality of alignment mark portions are spaced from the mask portion, and each of the plurality of alignment mark portions is located adjacent to corresponding one of a plurality of corners of the mask portion.

16. The tiled display device of claim 14, wherein each of the plurality of alignment mark portions protrudes from a corresponding one of a plurality of corners of the mask portion.

17. The tiled display device of claim 13, wherein each of the plurality of display devices further comprises:
- a flexible film on the other surface of the insulating layer and connected to the pad unit; and
- a source driver on the flexible film.

18. The tiled display device of claim 13, wherein the display area comprises at least one line connected to each of the plurality of pixels, and
the connection line is connected to the at least one line.

19. The tiled display device of claim 13, wherein the display layer comprises a plurality of data lines and a plurality of connection lines, and
each of the plurality of data lines is connected to a corresponding one of the plurality of connection lines through a plurality of through holes.

20. The tiled display device of claim 19, wherein the plurality of through holes corresponding to adjacent data lines from among the plurality of data lines are spaced from each other along a direction perpendicular to the data line.

* * * * *